(12) United States Patent
Hoshino et al.

(10) Patent No.: US 11,768,323 B2
(45) Date of Patent: *Sep. 26, 2023

(54) POLARIZER AND IMAGE DISPLAY DEVICE

(71) Applicant: FUJIFILM Corporation, Tokyo (JP)

(72) Inventors: Wataru Hoshino, Kanagawa (JP);
Yoshiaki Takada, Kanagawa (JP);
Yasuhiro Ishiwata, Kanagawa (JP);
Yuzo Fujiki, Kanagawa (JP); Kengo Saito, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/130,600

(22) Filed: Dec. 22, 2020

(65) Prior Publication Data

US 2021/0109270 A1  Apr. 15, 2021

Related U.S. Application Data

(63) Continuation of application No. PCT/JP2019/023916, filed on Jun. 17, 2019.

(30) Foreign Application Priority Data

Jun. 27, 2018  (JP) ................. 2018-122454

(51) Int. Cl.
*G02B 5/30* (2006.01)
*G02F 1/1335* (2006.01)
*H10K 50/86* (2023.01)

(52) U.S. Cl.
CPC ..... *G02B 5/3016* (2013.01); *G02F 1/133528* (2013.01); *H10K 50/86* (2023.02); *G02F 2203/055* (2013.01)

(58) Field of Classification Search
CPC ............ G02B 5/3016; G02F 1/133528; G02F 2203/055; G02F 2202/043; H01L 51/5281;
(Continued)

(56) References Cited

U.S. PATENT DOCUMENTS

2011/0177315 A1    7/2011  Iwahashi et al.
2013/0070899 A1*   3/2013  Morishima ........... C09B 29/081
                                                       378/71
(Continued)

FOREIGN PATENT DOCUMENTS

JP    2011-215336 A   10/2011
JP    2011-237513 A   11/2011
(Continued)

OTHER PUBLICATIONS

International Search Report issued in PCT/JP2019/023916 dated Sep. 3, 2019.

(Continued)

*Primary Examiner* — Mariam Qureshi
(74) *Attorney, Agent, or Firm* — EDWARDS NEILS LLC; Jean C. Edwards, Esq.

(57) ABSTRACT

A polarizer with a high degree of alignment and an image display device including the polarizer. The polarizer is formed of a polarizer-forming composition containing a liquid crystal compound, a first dichroic material, and a second dichroic material, in which the polarizer has an array structure formed of the first dichroic material and an array structure formed of the second dichroic material.

9 Claims, 3 Drawing Sheets

(58) Field of Classification Search
CPC ............... H01L 27/32; C09K 19/3852; C09K 2019/0448; C09K 19/601
See application file for complete search history.

(56) References Cited

U.S. PATENT DOCUMENTS

| | | | |
|---|---|---|---|
| 2017/0022417 A1* | 1/2017 | Hatanaka | C09K 19/3068 |
| 2017/0031074 A1 | 2/2017 | Kong et al. | |
| 2018/0067348 A1* | 3/2018 | Hatanaka | C09K 19/04 |
| 2018/0346633 A1 | 12/2018 | Hoshino et al. | |
| 2018/0362768 A1 | 12/2018 | Hoshino et al. | |
| 2021/0207030 A1* | 7/2021 | Ota | G02B 1/08 |

FOREIGN PATENT DOCUMENTS

| | | |
|---|---|---|
| JP | 2013-210624 A | 10/2013 |
| WO | 2010/038817 A1 | 4/2010 |
| WO | 2015/122387 A1 | 8/2015 |
| WO | 2017/154695 A1 | 9/2017 |
| WO | 2017/154907 A1 | 9/2017 |

OTHER PUBLICATIONS

Written Opinion issued in PCT/JP2019/023916 dated Sep. 3, 2019.
International Preliminary Report on Patentability completed by WIPO on Dec. 29, 2020 in connection with International Patent Application No. PCT/JP2019/023916.
Office Action, issued by the Japanese Patent Office dated Sep. 21, 2021, in connection with Japanese Patent Application No. 2020-527410.
Office Action issued by The State Intellectual Property Office of People's Republic of China dated Jan. 5, 2022, in connection with Chinese Patent Application No. 201980042963.9.
Office Action, issued by the Japanese Patent Office dated Jul. 5, 2022, in connection with Japanese Patent Application No. 2020-527410.
Office Action, issued by the State Intellectual Property Office dated Aug. 3, 2022, in connection with Chinese Patent Application No. 201980042963.9.
Office Action, issued by the Japanese Patent Office dated Jan. 4, 2022, in connection with Japanese Patent Application No. 2020-527410.

* cited by examiner

POLARIZER AND IMAGE DISPLAY DEVICE

CROSS-REFERENCE TO RELATED APPLICATIONS

This application is a Continuation of PCT International Application No. PCT/JP2019/023916 filed on Jun. 17, 2019, which was published under PCT Article 21(2) in Japanese, and which claims priority under 35 U.S.C. § 119(a) to Japanese Patent Application No. 2018-122454 filed on Jun. 27, 2018. The above applications are hereby expressly incorporated by reference, in their entirety, into the present application.

BACKGROUND OF THE INVENTION

1. Field of the Invention

The present invention relates to a polarizer and an image display device.

2. Description of the Related Art

In the related art, in a case where an attenuation function, a polarization function, a scattering function, a light-shielding function of irradiation light including laser light or natural light is required, a device that is operated according to principles different for each function is used. Therefore, products corresponding to the above-described functions are also produced by production processes different for each function.

For example, a linear polarizer or a circular polarizer is used in an image display device (for example, a liquid crystal display device) to control optical rotation or birefringence in display. Further, a circular polarizer is used in an organic light emitting diode (OLED) to prevent reflection of external light.

In the related art, iodine has been widely used as a dichroic material in these polarizers, but a polarizer that uses an organic dye in place of iodine as a dichroic material has also been examined.

For example, WO2017/154907A discloses a polarizer-forming composition which contains a polymer liquid crystal compound and a dichroic material.

SUMMARY OF THE INVENTION

As a result of preparation of a polarizer with reference to the examples of WO2017/154907A and evaluation of the degree of alignment thereof which are conducted by the present inventors under the above-described circumstance, it was clarified that further improvement of the degree of alignment is desirable in consideration of improvement of the performance of an image display device or the like expected in the future.

Further, in consideration of the above-described circumstances, an object of the present invention is to provide a polarizer with a high degree of alignment and an image display device including the polarizer.

As a result of intensive examination conducted by the present inventors in order to achieve the above-described object, it was found that the degree of alignment is improved in a case where a polarizer which is formed of a polarizer-forming composition containing a liquid crystal compound, a first dichroic material, and a second dichroic material has an array structure formed of the first dichroic material and an array structure formed of the second dichroic material, thereby completing the present invention.

That is, the present inventors found that the above-described problems can be solved by employing the following configurations.

[1] A polarizer which is formed of a polarizer-forming composition containing a liquid crystal compound a first dichroic material, and a second dichroic material, in which the polarizer has an array structure formed of the first dichroic material and an array structure formed of the second dichroic material.

[2] The polarizer according to [1], in which the first dichroic material forms an associate in the array structure formed of the first dichroic material, and the second dichroic material forms an associate in the array structure formed of the second dichroic material.

[3] The polarizer according to [1] or [2], in which Expressions (a) and (II) are satisfied.

$$|\lambda M - \lambda 1| \leq 5 \text{ nm} \quad (I)$$

$$|\lambda 1 - \lambda 1'| \geq 5 \text{ nm} \quad (II)$$

Here, in Expressions (I) and (II), $\lambda M$ represents a maximum absorption wavelength in a difference spectrum between an absorption spectrum of a film formed of a composition that contains the first dichroic material, the second dichroic material, and the liquid crystal compound and an absorption spectrum of a film formed of a composition that contains the second dichroic material and the liquid crystal compound but does not contain the first dichroic material, $\lambda 1$ represents a maximum absorption wavelength in an absorption spectrum of a film formed of a composition that contains the first dichroic material and the liquid crystal compound but does not contain the second dichroic material, and $\lambda 1'$ represents a maximum absorption wavelength in an absorption spectrum of a solution in which the first dichroic material is dissolved.

[4] The polarizer according to any one of [1] to [3], in which Expressions (III) and (IV) are satisfied.

$$|\lambda C - \lambda 2| \leq 5 \text{ nm} \quad (III)$$

$$|\lambda 2 - \lambda 2'| \geq 5 \text{ nm} \quad (IV)$$

Here, in Expressions (III) and (IV), XC represents a maximum absorption wavelength in a difference spectrum between an absorption spectrum of a film formed of a composition that contains the first dichroic material, the second dichroic material, and the liquid crystal compound and an absorption spectrum of a film formed of a composition that contains the first dichroic material and the liquid crystal compound but does not contain the second dichroic material, $\lambda 2$ represents a maximum absorption wavelength in an absorption spectrum of a film formed of a composition that contains the second dichroic material and the liquid crystal compound but does not contain the first dichroic material, and $\lambda 2'$ represents a maximum absorption wavelength in an absorption spectrum of a solution in which the second dichroic material is dissolved.

[5] The polarizer according to any one of [1] to [4], in which the first dichroic material forms a crystal structure in the array structure formed of the first dichroic material, and the second dichroic material forms a crystal structure in the array structure formed of the second dichroic material.

[6] The polarizer according to any one of [1] to [5], in which Expression (V) is satisfied.

$$0.9 \leq MO/M \leq 1.1 \quad (V)$$

Here, in Expression (V), MO represents an intensity of a peak derived from a periodic structure of the first dichroic material in an X-ray diffraction spectrum of a film formed of a composition that contains the first dichroic material, the second dichroic material, and the liquid crystal compound, and M represents an intensity of a peak derived from a periodic structure of the first dichroic material in an X-ray diffraction spectrum of a film formed of a composition that contains the first dichroic material and the liquid crystal compound but does not contain the second dichroic material.

[7] The polarizer according to any one of [1] to [6], in which Expression (VI) is satisfied.

$$0.9 \leq CO/C \leq 1.1 \quad \text{(VI)}$$

Here, in Expression (VI), CO represents an intensity of a peak derived from a periodic structure of the second dichroic material in an X-ray diffraction spectrum of a film formed of a composition that contains the first dichroic material, the second dichroic material, and the liquid crystal compound, and C represents an intensity of a peak derived from a periodic structure of the second dichroic material in an X-ray diffraction spectrum of a film formed of a composition that contains the second dichroic material and the liquid crystal compound but does not contain the first dichroic material.

[8] The polarizer according to any one of [1] to [7], in which the first dichroic material is a dichroic material having a maximum absorption wavelength in a range of 455 nm or greater and less than 560 nm, and the second dichroic material is a dichroic material having a maximum absorption wavelength in a range of 560 nm to 700 nm.

[9] The polarizer according to [8], in which the polarizer-forming composition further contains a third dichroic material having a maximum absorption wavelength in a range of 380 nm or greater and less than 455 nm.

[10] The polarizer according to any one of [1] to [9], in which an absolute value of a difference between a log P value of a side chain of the first dichroic material and a log P value of a side chain of the second dichroic material is 1.1 or greater.

[11] An image display device comprising: the polarizer according to any one of [1] to [10].

As described below, according to the present invention, it is possible to provide a polarizer with a high degree of alignment and an image display device including the polarizer.

DESCRIPTION OF THE PREFERRED EMBODIMENTS

Hereinafter, the present invention will be described in detail.

The description of constituent elements described below may be made based on typical embodiments of the present invention, but the present invention is not limited to such embodiments.

In addition, in the present specification, a numerical range shown using "to" indicates a range including numerical values described before and after "to" as a lower limit and an upper limit.

Moreover, materials corresponding to respective components may be used alone or in combination of two or more kinds thereof as the respective components. Here, in a case where two or more kinds of respective components are used in combination, the content of the components indicates the total content of the combined components unless otherwise specified.

Further, "(meth)acrylate" is a notation representing "acrylate" or "methacrylate", "(meth)acryl" is a notation representing "acryl" or "methacryl", and "(meth)acryloyl" is a notation representing "acryloyl" or "methacryloyl".

[Polarizer]

A polarizer according to the embodiment of the present invention is a polarizer formed of a polarizer-forming composition containing a liquid crystal compound, a first dichroic material, and a second dichroic material.

Further, the polarizer according to the embodiment of the present invention has an array structure formed of the first dichroic material (hereinafter, also referred to as a "first array structure") and an array structure formed of the second dichroic material (hereinafter, also referred to as a "second array structure"). That is, the polarizer according to the embodiment of the present invention has the first array structure and the second array structure separately.

In the present invention, the first array structure indicates a state in which two or more molecules of the first dichroic material are aggregated in the polarizer to form an aggregate and the molecules of the first dichroic material in the aggregate are periodically arranged. Similarly, the second array structure indicates a state in which two or more molecules of the second dichroic material are aggregated in the polarizer to form an aggregate and the molecules of the second dichroic material in the aggregate are periodically arranged.

Figure 1:
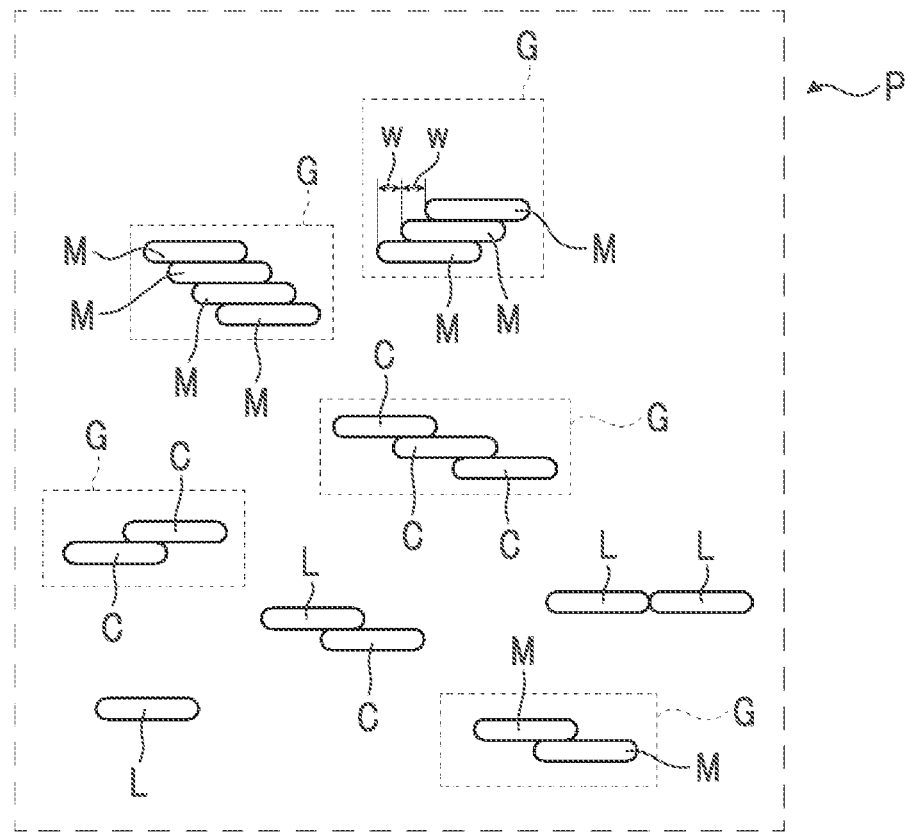
FIG. 1 is a conceptual view showing an example of a state in which a polarizer has an array structure formed of a first dichroic material and an array structure formed of a second dichroic material.

FIG. 1 is a conceptual view showing an example of a state in which the polarizer has an array structure formed of the first dichroic material and an array structure formed of the second dichroic material.

A polarizer P shown in FIG. 1 has molecules NI of the first dichroic material, molecules O of the second dichroic material, and molecules L of the liquid crystal compound.

Further, as shown in FIG. 1, an aggregate G having two or more molecules M and an aggregate G having two or more molecules C are formed. The major axis directions of the molecules M or the molecules C in these aggregates G are arranged along the same direction, and the molecules M or the molecules C are arranged so as to be displaced with a period of a width w.

Figure 2:
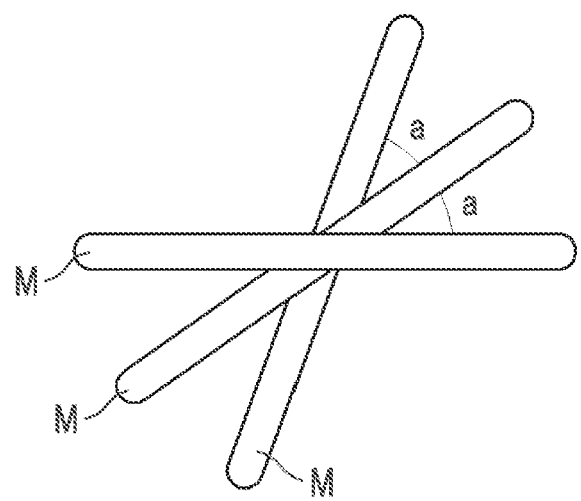
FIG. 2 is a conceptual view showing one embodiment of an array structure.

Further, the first array structure and the second array structure are not limited to the array structure of FIG. 1, and for example, the molecules M (the molecules C in the second array structure) may be arranged so as to be displaced with a period of an angle a as shown in FIG. 2.

Further, the first dichroic material may be polymerized in the polarizer. Similarly, the second dichroic material may also be polymerized in the polarizer.

[Polarizer-Forming Composition]

The polarizer-forming composition (hereinafter, also referred to as the "present composition") used for forming the polarizer according to the embodiment of the present invention contains a liquid crystal compound, a first dichroic material, and a second dichroic material. The present composition may contain a third dichroic material, a solvent, a polymerization initiator, an interface modifier, or components other than those described above as necessary.

Hereinafter, each component will be described.

<Liquid Crystal Compound>

The present composition contains a liquid crystal compound. In a case where the composition contains a liquid crystal compound, the dichroic materials can be aligned with a high degree of alignment while the precipitation of the dichroic materials is suppressed.

The liquid crystal compound is a liquid crystal compound that does not exhibit dichroism.

As the liquid crystal compound, any of a low-molecular-weight liquid crystal compound and a polymer liquid crystal compound can be used. Here, the "low-molecular-weight liquid crystal compound" indicates a liquid crystal compound having no repeating unit in the chemical structure. The "polymer liquid crystal compound" indicates a liquid crystal compound having a repeating unit in the chemical structure.

Examples of the low-molecular-weight liquid crystal compound include liquid crystal compounds described in SP2013-228706A.

Examples of the polymer liquid crystal compound include thermotropic liquid crystal polymers described in JP2011-237513A. Further, the polymer liquid crystal compound may have a crosslinkable group (such as an acryloyl group or a methacryloyl group) at a terminal.

The liquid crystal compound may be used alone or in combination of two or more kinds thereof.

The content of the liquid crystal compound is preferably in a range of 25 to 2500 parts by mass, more preferably in a range of 33 to 2000 parts by mass, and still more preferably in a range of 50 to 1000 parts by mass with respect to 100 parts by mass which is the content of the dichroic materials in the present composition. In a case where the content of the liquid crystal compound is in the above-described range, the degree of alignment of the polarizer is further improved.

Further, the "content of the dichroic materials in the present composition" indicates the total amount of the first dichroic material and the second dichroic material. In a case where the present composition contains the third dichroic material, the content of the third dichroic material is included in the total amount.

From the viewpoint of further improving the degree of alignment of the polarizer to be obtained, it is preferable that the liquid crystal compound is a polymer liquid crystal compound having a repeating unit represented by Formula (1) (hereinafter, also referred to as a "repeating unit (1)"). Hereinafter, in the description below, "the degree of alignment of the polarizer to be obtained is further improved" will also be referred to as "the effects of the present invention are more excellent".

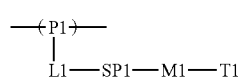
(1)

in Formula (I), P1 represents a main chain of the repeating unit, L1 represents a single bond or a divalent linking group, SP1 represents a spacer group, M1 represents a mesogen group, and T1 represents a terminal group.

Specific examples of the main chain of the repeating unit represented by P1 include groups represented by Formulae (P1-A) to (P1-D). Among these, from the viewpoints of diversity and handleability of a monomer serving as a raw material, a group represented by Formula (P1-A) is preferable.

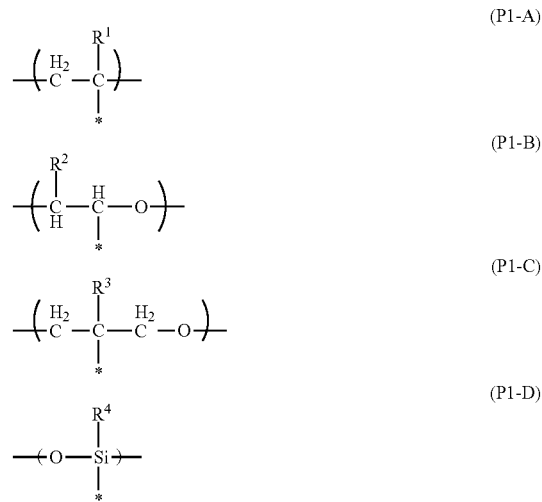

In Formulae (P1-A) to (P1-D), "*" represents a bonding position with respect to L1 in Formula (1).

In Formulae (P1-A) to (P1-D), $R^1$, $R^2$, $R^3$, and $R^4$ each independently represent a hydrogen atom, a halogen atom, a cyano group, or an alkyl group having 1 to 10 carbon atoms, or an alkoxy group having 1 to 10 carbon atoms. The alkyl group may be a linear or branched alkyl group or an alkyl group having a cyclic structure (cycloalkyl group). Further, the number of carbon atoms of the alkyl group is preferably in a range of 1 to 5.

It is preferable that the group represented by Formula (P1-A) is a unit of a partial structure of poly(meth)acrylic acid ester obtained by polymerization of (meth)acrylic acid ester.

It is preferable that the group represented by Formula (P1-B) is an ethylene glycol unit formed by ring-opening polymerization of an epoxy group of a compound containing the epoxy group.

It is preferable that the group represented by Formula (P1-C) is a propylene glycol unit formed by ring-opening polymerization of an oxetane group of a compound having the oxetane group.

It is preferable that the group represented by Formula (P1-D) is a siloxane unit of a polysiloxane obtained by polycondensation of a compound containing at least one of an alkoxysilyl group or a silanol group. Here, examples of the compound containing at least one of an alkoxysilyl group or a silanol group include a compound containing a group represented by Formula $SiR^{14}(OR^{15})_2$—. In the formula, $R^{14}$ has the same definition as that for $R^{14}$ in (P1-D), and a plurality of $R^{15}$'s each independently represent a hydrogen atom or an alkyl group having 1 to 10 carbon atoms.

In Formula (I), L1 represents a single bond or a divalent linking group.

Examples of the divalent linking group represented by L1 include —C(O)O—, —OC(O)—, —O—, —S—, —C(O)NR$^3$—, —NR$^3$C(O)—, —SO$_2$—, and —NR$^3$R$^4$—. In the formulae, $R^3$ and $R^4$ each independently represent a hydrogen atom or an alkyl group having 1 to 6 carbon atoms which may have a substituent.

In a case where P1 represents a group represented by Formula (P1-A), from the viewpoint that the effects of the present invention are more excellent, it is preferable that L1 represents a group represented by —C(O)O—.

In a case where P1 represents a group represented by any of Formulae (P1-B) to (P1-D), from the viewpoint that the effects of the present invention are more excellent, it is preferable that l1 represents a single bond.

From the viewpoints of easily exhibiting the liquid crystallinity and the availability of raw materials, it is preferable that the spacer group represented by SP1 in Formula (1) has at least one structure selected from the group consisting of an oxyethylene structure, an oxypropylene structure, a polysiloxane structure, and an alkylene fluoride structure.

Here, as the oxyethylene structure represented by SP1, a group represented by *—(CH$_2$—CH$_2$O)$_{n1}$—* is preferable. In the formula, n1 represents an integer of 1 to 20, and "*" represents a bonding position with respect to L1 or M1 in Formula (1). From the viewpoint that the effects of the present invention are more excellent, n1 represents preferably an integer of 2 to 10, more preferably an integer of 2 to 4, and most preferably 3.

Further, from the viewpoint that the effects of the present invention are more excellent, a group represented by *—(CH(CH$_3$)—CH$_2$O)$_{n2}$—* is preferable as the oxypropylene structure represented by SP1. In the formula, n2 represents an integer of 1 to 3, and "*" represents a bonding position with respect to L1 or M1.

Further, from the viewpoint that the effects of the present invention are more excellent, a group represented by *—(Si(CH$_3$)$_2$—O)$_{n3}$—* is preferable as the polysiloxane structure represented by SP1. In the formula, n3 represents an integer of 6 to 10, and "*" represents a bonding position with respect to L1 or M1.

Further, from the viewpoint that the effects of the present invention are more excellent, a group represented by *—(CF$_2$—CF$_2$)$_{n4}$—* is preferable as the alkylene fluoride structure represented by SP1. In the formula, n4 represents an integer of 6 to 10, and "*" represents a bonding position with respect to L1 or M1.

In Formula (1), the mesogen group represented by M1 is a group showing a main skeleton of a liquid crystal molecule that contributes to liquid crystal formation. A liquid crystal molecule exhibits liquid crystallinity which is in an intermediate state (mesophase) between a crystal state and an isotropic liquid state. The mesogen group is not particularly limited and can refer to, for example, description on pages 7 to 16 of "FlussigeKristalle in Tabellen II" (VEB Deutsche Verlag fur Grundstoff Industrie, Leipzig, 1984) and the description in Chapter 3 of "Liquid Crystal Handbook" (Mantizen, 2000) edited by Liquid Crystals Handbook Editing Committee.

As the mesogen group, for example, a group having at least one cyclic structure selected from the group consisting of an aromatic hydrocarbon group, a heterocyclic group, and an alicyclic group is preferable.

From the viewpoint that the effects of the present invention are more excellent, the mesogen group contains preferably an aromatic hydrocarbon group, more preferably 2 to 4 aromatic hydrocarbon groups, and still more preferably 3 aromatic hydrocarbon groups.

From the viewpoints of exhibiting the liquid crystallinity, adjusting the liquid crystal phase transition temperature, and the availability of raw materials and synthetic suitability and from the viewpoint that the effects of the present invention are more excellent, as the mesogen group, a group represented by Formula (M1-A) or Formula (M1-B) is preferable, and a group represented by Formula (M1-B) is more preferable.

In Formula (M1-A), A1 represents a divalent group selected from the group consisting of an aromatic hydrocarbon group, a heterocyclic group, and an alicyclic group. These groups may be substituted with an alkyl group, a fluorinated alkyl group, an alkoxy group, or a substituent.

The divalent group represented by A1 is preferably a 4- to 6-membered ring. Further, the divalent group represented by A1 may be a monocycle or a fused ring.

Further, "*" represents a bonding position with respect to SP1 or T1.

Examples of the divalent aromatic hydrocarbon group represented by A1 include a phenylene group, a naphthylene group, a fluorene-diyl group, an anthracene-diyl group, and a tetracene-diyl group. From the viewpoints of design diversity of a mesogenic skeleton and the availability of raw materials, a phenylene group or a naphthylene group is preferable, and a phenylene group is more preferable.

The divalent heterocyclic group represented by A1 may be any of aromatic or non-aromatic, but a divalent aromatic heterocyclic group is preferable as the divalent heterocyclic group from the viewpoint of further improving the degree of alignment.

The atoms other than carbon constituting the divalent aromatic heterocyclic group include a nitrogen atom, a sulfur atom, and an oxygen atom. In a case where the aromatic heterocyclic group has a plurality of atoms constituting a ring other than carbon, these may be the same as or different from each other.

Specific examples of the divalent aromatic heterocyclic group include a pyridylene group (pyridine-diyl group), a pyridazine-diyl group, an imidazole-diyl group, thienylene group (thiophene-diyl group), a quinolylene group (quinoline-diyl group), an isoquinolylene group (isoquinolin-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 represents 2 or greater, a plurality of A1's may be the same as or different from each other.

In Formula (M1-B), A2 and A3 each independently represent a divalent group selected from the group consisting of an aromatic hydrocarbon group, a heterocyclic group, and an alicyclic group. Specific examples and preferred embodiments of A2 and A3 are the same as those for A1 in Formula (M1-A), and thus description thereof will not be repeated.

In Formula (M1-B), a2 represents an integer of 1 to 10. In a case where a2 represents 2 or greater, a plurality of A2's may be the same as or different from each other, a plurality of A3's may be the same as or different from each other, and a plurality of LA1's may be the same as or different from each other. From the viewpoint that the effects of the present invention are more excellent, a2 represents preferably an integer of 2 or greater and more preferably 2.

In Formula (M1-B), in a case where a2 represents 1, LA1 represents a divalent linking group. In a case where a2 represents 2 or greater, a plurality of LA1's each independently represent a single bond or a divalent linking group, and at least one of the plurality of LA1's is a divalent linking group. In a case where a2 represents 2, from the viewpoint that the effects of the present invention are more excellent, it is preferable that one of the two LA1's represents a divalent linking group and the other represents a single bond.

Examples of the divalent linking group represented by LA1 in Formula (M1-B) include —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—, —S—C(O)—C(Z)=C(Z')—, —C(Z)=N—N=C(Z')—(Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, and —C(O)S—. Among these, from the viewpoint that the effects of the present invention are more excellent, —C(O)O— is preferable. LA1 may represent a group obtained by combining two or more of these groups.

Specific examples of M1 include the following structures. In the following specific examples, "Ac" represents an acetyl group.

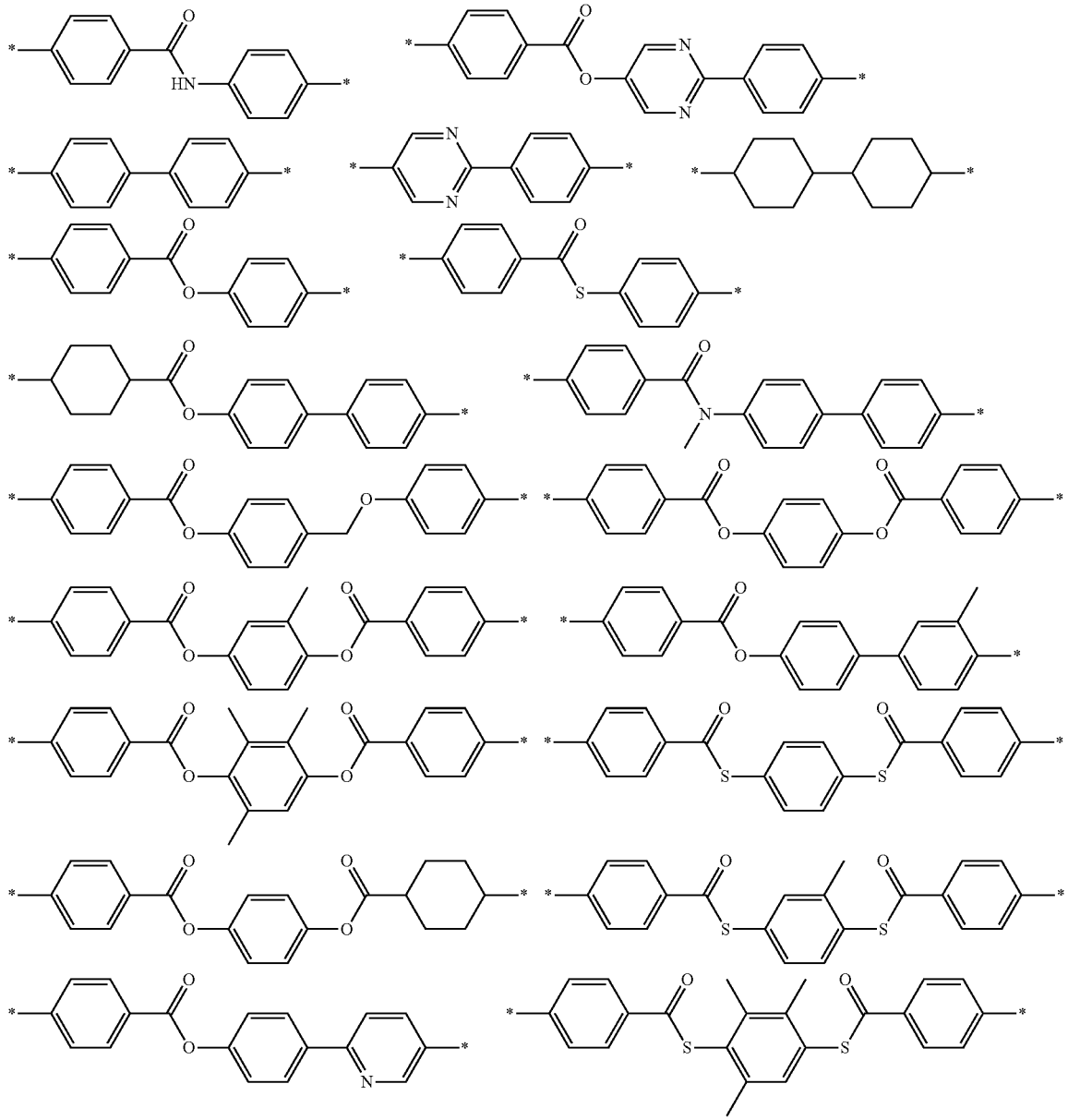

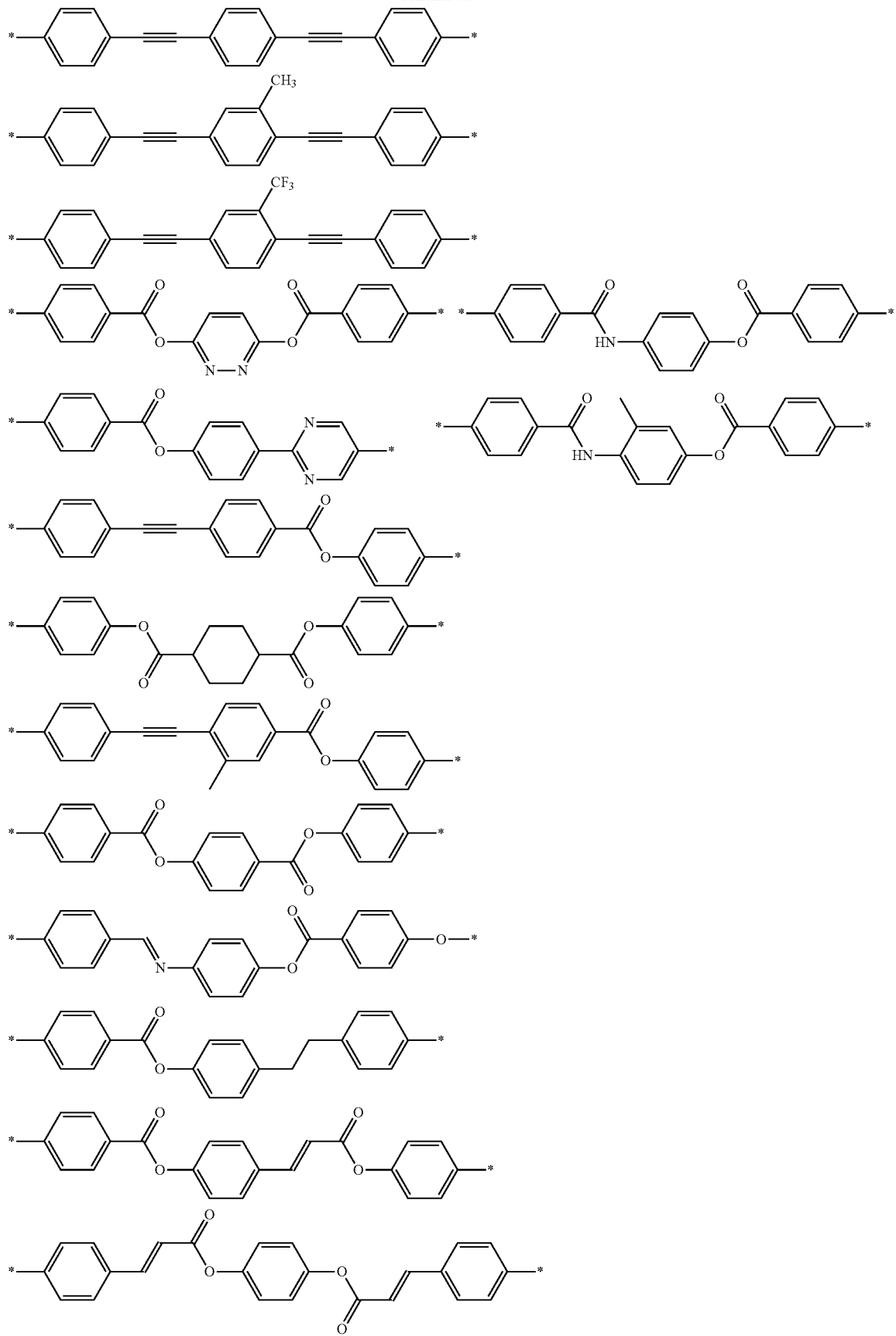

-continued
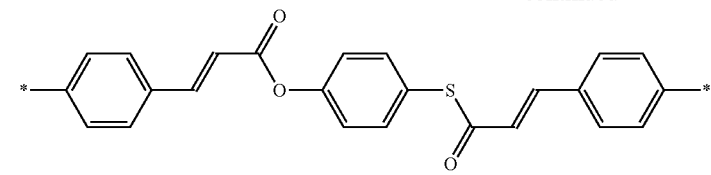
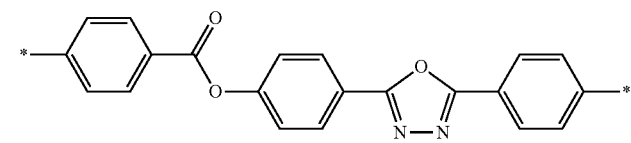
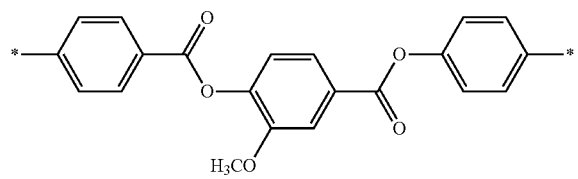
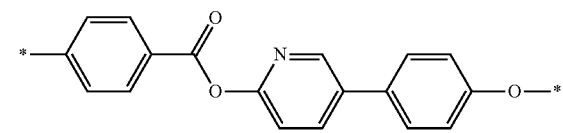
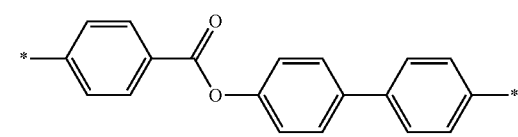
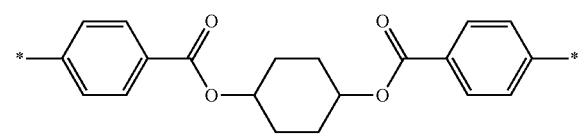
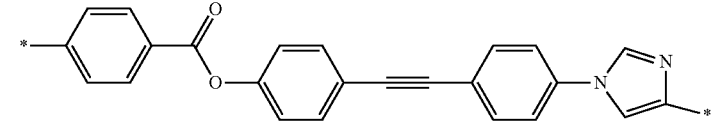
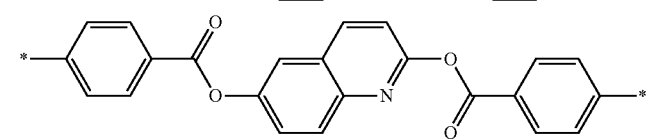
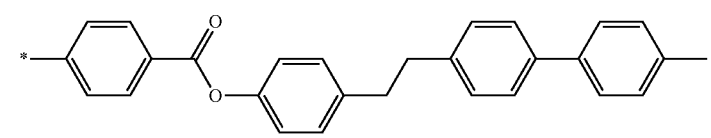
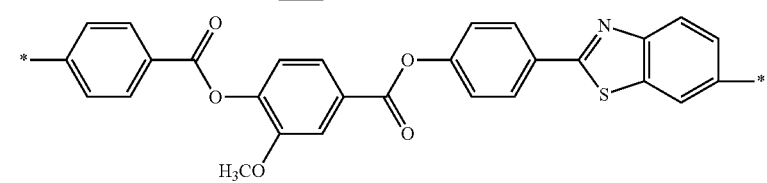
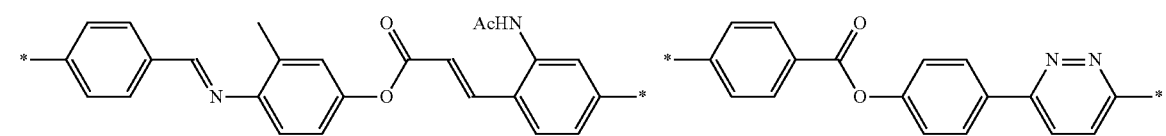
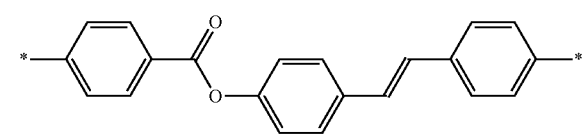
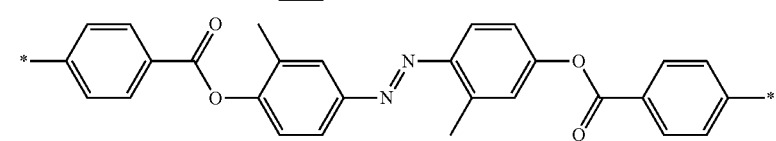
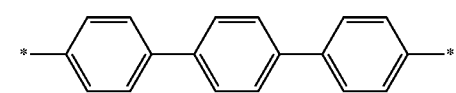

-continued
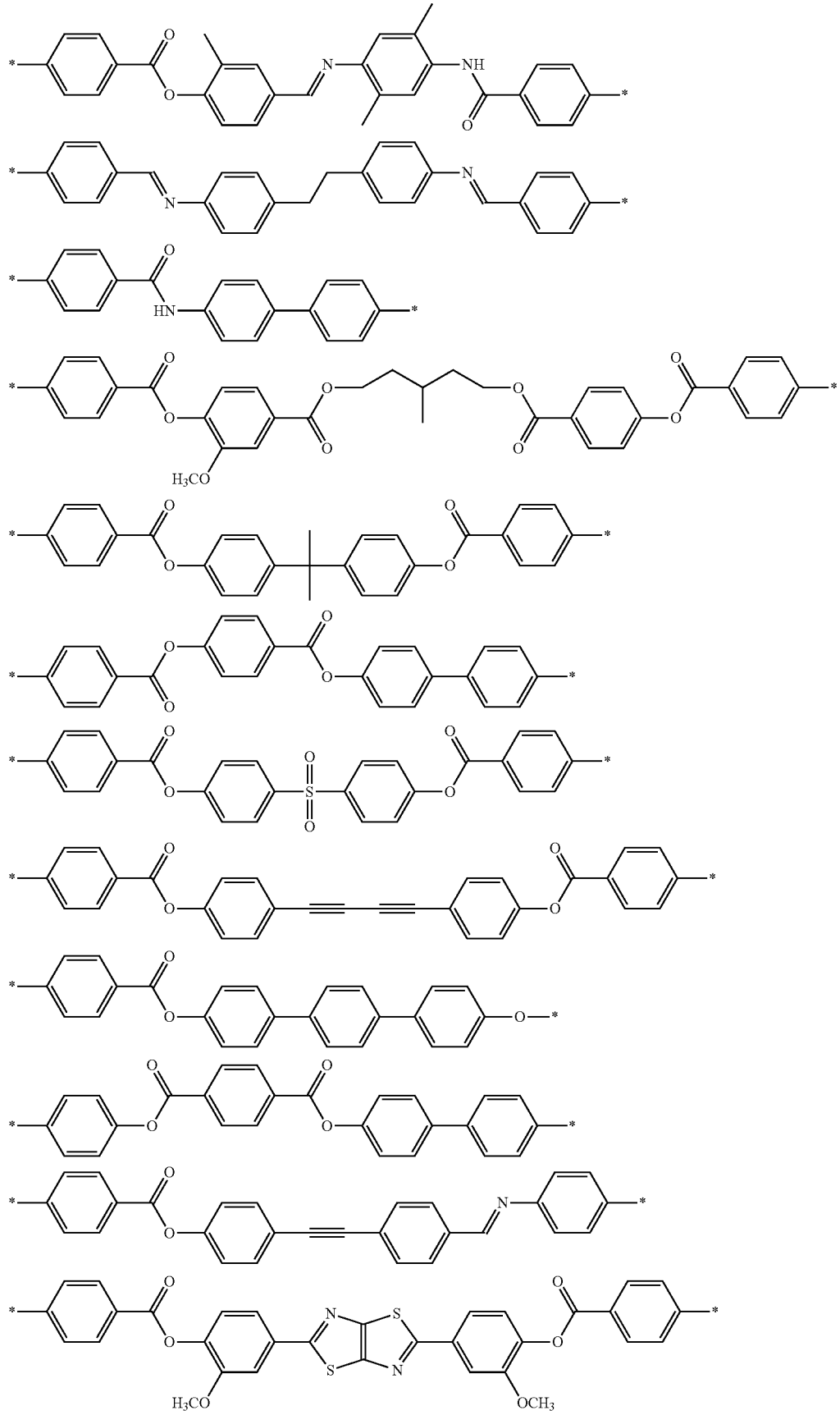

-continued

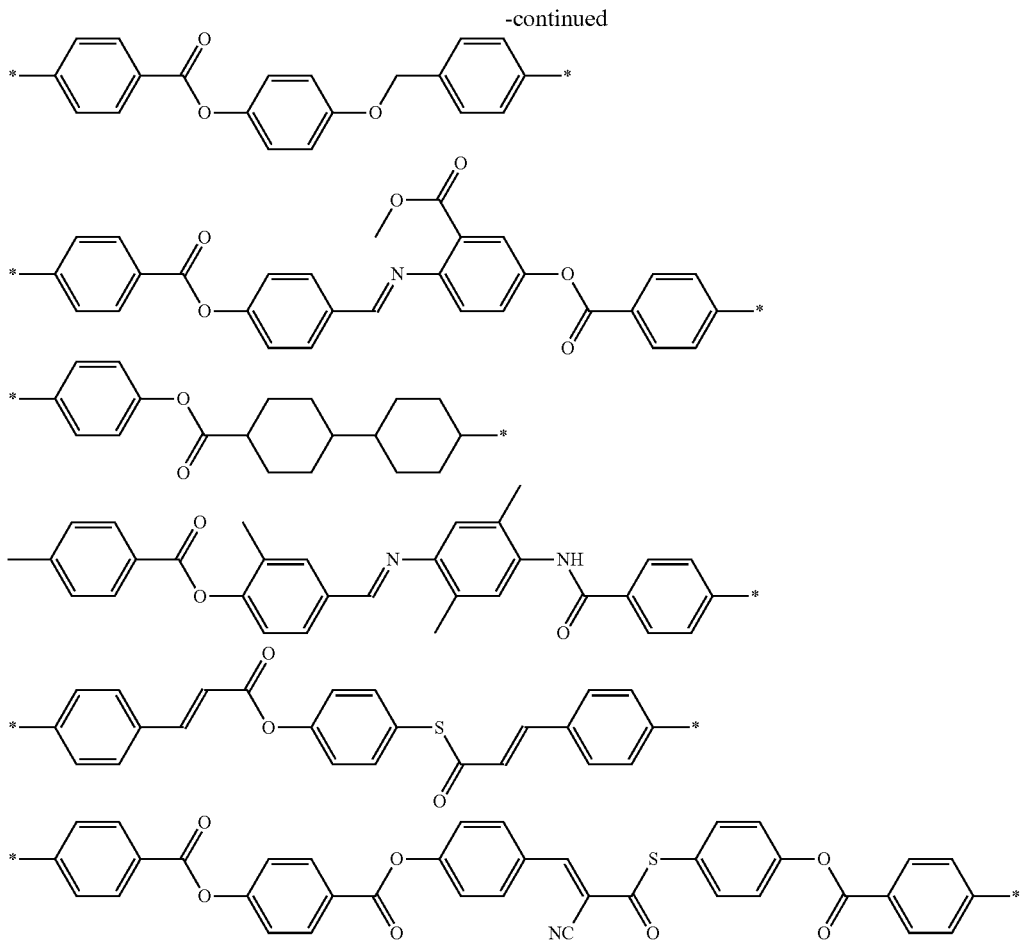

Examples of the terminal group represented by T1 in Formula (1) include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an alkoxycarbonyl group having 1 to 10 carbon atoms (ROC(O)—: R represents an alkyl group), an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureide group having 1 to 10 carbon atoms, and a (meth)acryloyloxy group-containing group. Examples of the (meth)acryloyloxy group-containing group include a group represented by -L-A (L represents a single bond or a linking group, specific examples of the linking group are the same as those for L1 and SP1 described above, and A represents a (meth)acryloyloxy group).

From the viewpoint that the effects of the present invention are more excellent, T1 represents preferably an alkoxy group having 1 to 10 carbon atoms, more preferably an alkoxy group having 1 to 5 carbon atoms, and still more preferably a methoxy group. These terminal groups may be further substituted with these groups or the polymerizable groups described in JP2010-244038A.

From the viewpoint that the effects of the present invention are more excellent, the number of atoms in the main chain of T1 is preferably in a range of 1 to 20, more preferably in a range of 1 to 15, still more preferably in a range of 1 to 10, and particularly preferably in a range of 1 to 7. In a case where the number of atoms in the main chain of T1 is 20 or less, the degree of alignment of the polarizer is further improved. Here, the "main chain" in T1 indicates the longest molecular chain bonded to M1, and the number of hydrogen atoms is not included in the number of atoms in the main chain of T1. For example, the number of atoms in the main chain is 4 in a case where T1 represents an n-butyl group, the number of atoms in the main chain is 3 in a case where T1 represents a see-butyl group.

From the viewpoint that the effects of the present invention are more excellent, the content of the repeating unit (1) is preferably in a range of 20% to 100% by mass with respect to 100% by mass of all the repeating units of the polymer liquid crystal compound.

In the present invention, the content of each repeating unit contained in the polymer liquid crystal compound is calculated based on the charged amount (mass) of each monomer used for obtaining each repeating unit.

The polymer liquid crystal compound may have only one or two or more kinds of the repeating units (1). Among these, from the viewpoint that the effects of the present invention are more excellent, the polymer liquid crystal compound may have two kinds of the repeating units (1).

In a case where the polymer liquid crystal compound has two kinds of the repeating units (1), from the viewpoint that the effects of the present invention are more excellent, it is preferable that the terminal group represented by T1 in one (repeating unit A) is an alkoxy group and the terminal group represented by T1 in the other (repeating unit B) is a group other than the alkoxy group.

From the viewpoint that the effects of the present invention are more excellent, as the terminal group represented by T1 in the repeating unit B, an alkoxycarbonyl group, a cyano group, or a (meth)acryloyloxy group-containing group is preferable, and an alkoxycarbonyl group or a cyano group is more preferable.

From the viewpoint that the effects of the present invention are more excellent, the ratio (A/B) of the content of the repeating unit A in the polymer liquid crystal compound to the content of the repeating unit B in the polymer liquid crystal compound is preferably in a range of 50/50 to 95/5, more preferably in a range of 60/40 to 93/7, and still more preferably in a range of 70/30 to 90/10.

(Weight-Average Molecular Weight)

From the viewpoint that the effects of the present invention are more excellent, the weight-average molecular weight (Mw) of the polymer liquid crystal compound is preferably in a range of 1000 to 500000 and more preferably in a range of 2000 to 300000. In a case where the Mw of the polymer liquid crystal compound is in the above-described range, the polymer liquid crystal compound is easily handled.

In particular, from the viewpoint of suppressing cracking during the coating, the weight-average molecular weight (Mw) of the polymer liquid crystal compound is preferably 10000 or greater and more preferably in a range of 10000 to 300000.

In addition, from the viewpoint of the temperature latitude of the degree of alignment, the weight-average molecular weight (Mw) of the polymer liquid crystal compound is preferably less than 10000 and more preferably 2000 or greater and less than 10000.

Here, the weight-average molecular weight and the number average molecular weight in the present invention are values measured according to gel permeation chromatography (OPC).

Solvent (eluent); N-methylpyrrolidone
Equipment name: TOSOH HLC-82200PC
Column: Connect and use three of TOSOH TSKgel Super AWM-H (6 mm×15 cm)
Column temperature: 25° C.
Sample concentration: 0.1% by mass
Flow rate: 0.35 mL/min
Calibration curve: TSK standard polystyrene (manufactured by TOSOH Corporation), calibration curves of 7 samples with Mw of 2800000 to 1050 (Mw/Mn=1.03 to 1.06) are used.

(Log P Value)

In the present invention, from the viewpoint that the compatibility between the first dichroic material and the second dichroic material described below is easily adjusted, the log P value of the liquid crystal compound is preferably in a range of 4.0 to 10, more preferably in a range of 4.3 to 9.5, and still more preferably in a range of 4.3 to 5.5.

Here, the log P value is an index for expressing the properties of the hydrophilicity and hydrophobicity of a chemical structure and is also referred to as a hydrophilic-hydrophobic parameter. The log P value can be calculated using software such as ChemBioDrawUltra or HSPiP (Ver. 4.1.07). Further, the toe value can be acquired experimentally by the method of the OECD Guidelines for the Testing of Chemicals, Sections 1, Test No. 117 or the like. In the present invention, a value calculated by inputting the structural formula of a compound to HSPiP (Ver. 4.1.07) is employed as the log P value unless otherwise specified.

<First Dichroic Material>

The first dichroic material contained in the present composition is not particularly limited as long as the first dichroic material is a compound different from the second dichroic material described below, and examples thereof include known dichroic materials of the related art, such as a visible light absorbing material (a dichroic dye), a light emitting material (a fluorescent material or a phosphorescent material), an ultraviolet absorbing material, an infrared absorbing material, a non-linear optical material, a carbon nanotube, and an inorganic material (for example, a quantum rod).

Among these, a compound having a chromophore which is a nucleus of a dichroic material and a side chain bonded to a terminal of the chromophore is preferable.

Specific examples of the chromophore include an aromatic ring group (such as an aromatic hydrocarbon group or an aromatic heterocyclic group) and an azo group. In addition, a structure containing both an aromatic hydrocarbon group and an azo group is preferable, and a bisazo or trisazo structure containing an aromatic hydrocarbon group and two or three azo groups is more preferable.

The side chain is not particularly limited, and examples thereof include a group represented by $R^1$, $R^2$, or $R^3$ in Formula (2).

Suitable examples of the first dichroic material include a dichroic dye compound having a structure represented by Formula (2).

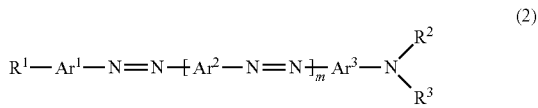

In Formula (2), m represents 1 or 2.
In Formula (2), $Ar^1$, $Ar^2$, and $Ar^3$ each independently represent a phenylene group which may have a substituent, a naphthylene group which may have a substituent, or a heterocyclic group which may have a substituent.

The heterocyclic group may be aromatic or non-aromatic.

Examples of atoms other than the carbon atoms constituting the aromatic heterocyclic group include a nitrogen atom, a sulfur atom, and an oxygen atom. In a case where the aromatic heterocyclic group has a plurality of atoms constituting a ring other than carbon, these may be the same as or different from each other.

Specific examples of the aromatic heterocyclic group include a pyridylene group (pyridine-diyl group), a pyridazine-diyl group, an imidazole-diyl group, thienylene group (thiophene-diyl group), a quinolylene group (quinoline-diyl group), an isoquinolylene group (isoquinolin-diyl group), an oxazole-diyl group, a thiazole-diyl group, an oxadiazole-diyl group, a benzothiazole-diyl group, a benzothiadiazole-diyl group, a phthalimido-diyl group, a thiazolothiazole-diyl group, and a thienothiophene-diyl group.

In Formula (2), R' represents a hydrogen atom, a linear or branched alkyl group having 1 to 20 carbon atoms which may have a substituent, an alkoxy group, an alkylthio group, an alkylsulfonyl group, an alkylcarbonyl group, an alkyloxycarbonyl group, an acyloxy group, an alkylcarbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkylphosphoric acid amide group, an alkylimino group, and an alkylsilyl group.

The carbon atoms of the alkyl group may be substituted with —O—, —CO—, —C(O)—O—, —O—C(O)—, —Si(CH$_3$)$_2$—O—Si(CH$_3$)$_2$—, —N(R1')—, —N(R1')-CO—, —CO—N(R1')-, —N(R1')-C(O)—O—, —O—C(O)—N(R1')-, —N(R1')-C(O)—N(R1')-, —CH=CH—, —C≡C—, —N=N—, —C(R1')=CH—C(O)—, or —O—C(O)—O—.

In a case where $R^1$ represents a group other than a hydrogen atom, the hydrogen atom in each group may be substituted with a halogen atom, a nitro group, a cyano group, —N(R1')$_2$, an amino group, —C(R1')=C(R1')-NO$_2$, —C(R1')=C(R1')-CN, or —C(R1')=C(CN)$_2$.

R1' represents a hydrogen atom or a linear or branched alkyl group having 1 to 6 carbon atoms. In a case where a plurality of (R1')'s are present in each group, these may be the same as or different from one another.

In Formula (2), $R^2$ and $R^3$ each independently represent a hydrogen atom, a linear or branched alkyl group having 1 to 20 carbon atoms which may have a substituent, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group.

The carbon atoms of the alkyl group may be substituted with —O—, —S—, —C(O)—, —C(O)—O—, —O—C(O)—, —C(O)—S—, —S—C(O)—, —Si(CH$_3$)$_2$—O—Si(CH$_3$)$_2$—, —NR2'-, —NR2'-CO—, —CO—NR2'-, —NR2'-C(O)—O—, —O—C—(O)—NR2'-, —NR2'-C(O)—NR2'-, —CH=CH—, —C=C—, —N=N—, —C(R2')=CH—C(O)—, —O—C(O)—O.

In a case where $R^2$ and $R^3$ represent a group other than a hydrogen atom, the hydrogen atom of each group may be substituted with a halogen atom, a nitro group, a cyano group, a —OH group, —N(R2')$_2$, an amino group, —C(R2')=C(R2')—NO$_2$, —C(R2')=C(R2')—CN, or —C(R2)=C(CN)$_2$.

R2' represents a hydrogen atom or a linear or branched alkyl group having 1 to 6 carbon atoms. In a case where a plurality of (R2')'s are present in each group, these may be the same as or different from one another.

$R^2$ and $R^3$ may be bonded to each other to form a ring, or $R^2$ or $R^3$ may be bonded to Ar$^3$ to form a ring.

From the viewpoint of the light fastness, it is preferable that $R^1$ represents an electron-withdrawing group and $R^2$ and $R^3$ represent a group having a low electron-donating property.

Specific examples of such groups as R' include an alkylsulfonyl group, an alkylcarbonyl group, an alkyloxycarbonyl group, an acyloxy group, an alkylsulfonylamino group, an alkylsulfamoyl group, an alkylsulfinyl group, and an alkylureido group, and examples of groups as $R^2$ and $R^3$ include groups having the following structures. In addition, the groups having the following structures are shown in the form having a nitrogen atom to which $R^2$ and $R^3$ are bonded in Formula (2).

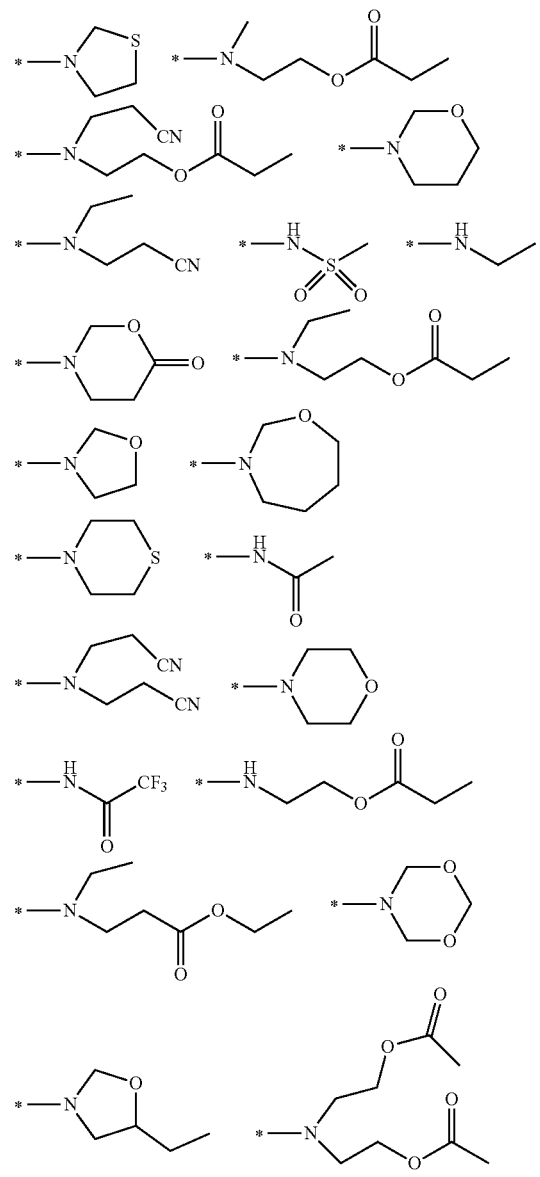

Specific examples of the dichroic dye compound having a structure represented by Formula (2) are shown below, but the invention is not limited thereto.

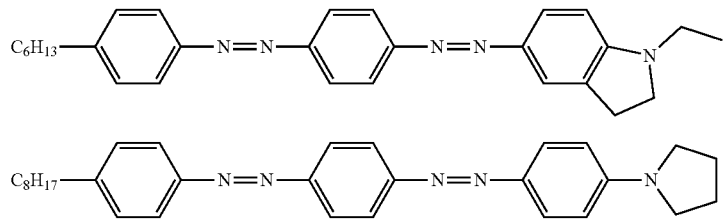

-continued

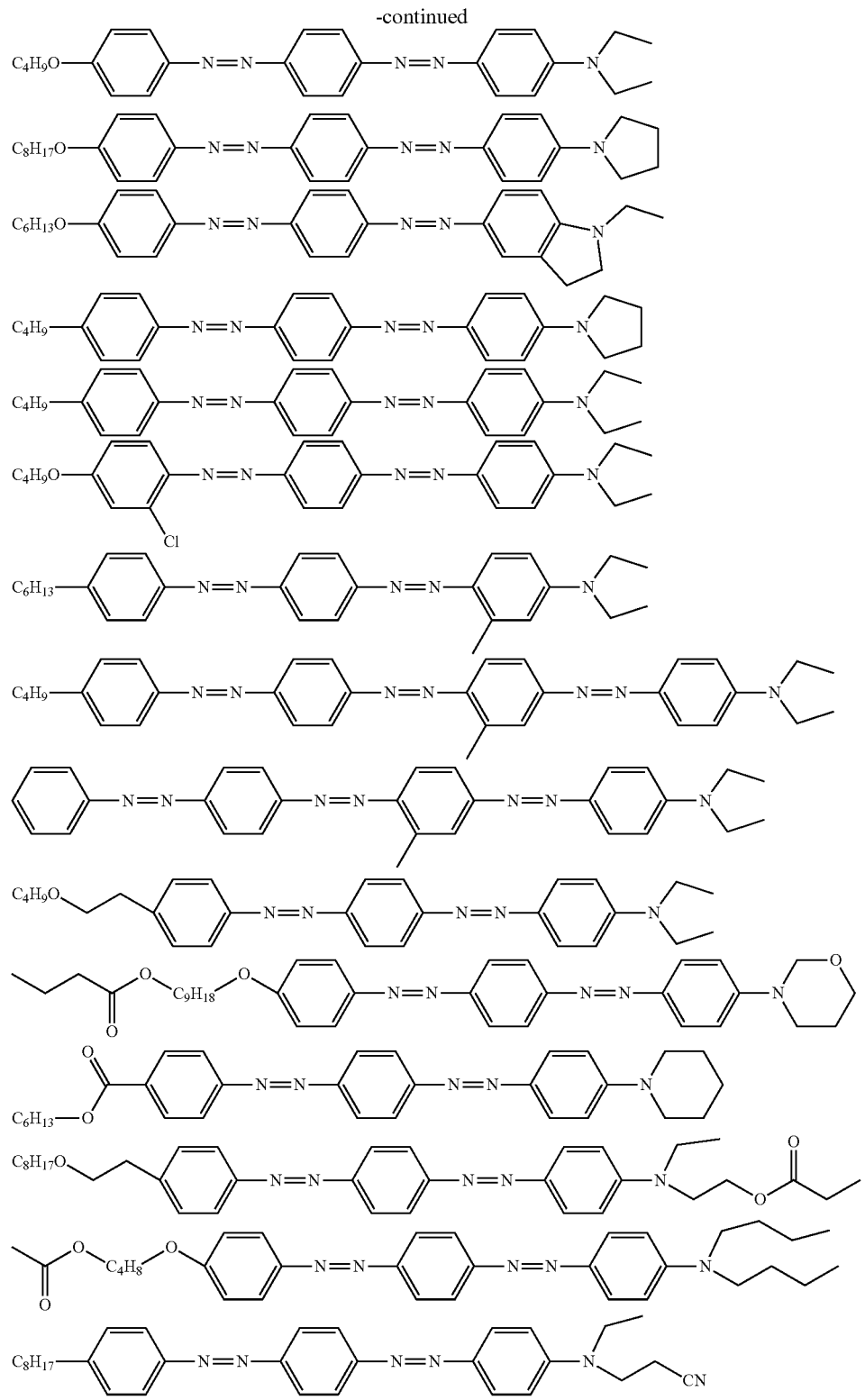

In the present invention, from the viewpoint of adjusting the tint of the polarizer, a dichroic material having a maximum absorption wavelength in a range of 455 nm or greater and less than 560 nm is preferable, a dichroic material having a maximum absorption wavelength in a range of 455 to 555 nm is more preferable, and a dichroic material having a maximum absorption wavelength in a range of 455 to 550 nm is still more preferable as the first dichroic material.

Particularly, the tint of the polarizer is more likely to be adjusted in a case of using the first dichroic material having a maximum absorption wavelength in a range of 455 nm or greater and less than 560 nm together with the second dichroic material having a maximum absorption wavelength in a range of 560 nm to 700 run as the second dichroic material described below.

Here, the maximum absorption wavelength (nm) of the dichroic material is acquired from an ultraviolet visible spectrum in a wavelength range of 380 to 800 nm measured by a spectrophotometer using a solution prepared by dissolving the dichroic material in a good solvent.

Further, in the present invention, from the viewpoint of easily forming the first array structure, the difference between the log P value of the first dichroic material and the log P value of the liquid crystal compound described above is preferably 3.4 or greater and more preferably 4.6 or greater.

From the same viewpoint as described above, the log P value of the first dichroic material is preferably 8 to 15 and more preferably in a range of 9.2 to 13.

<Second Dichroic Material>

The second dichroic material contained in the present composition is not particularly limited as long as the second dichroic material is a compound different from the first dichroic material described above, and examples thereof include known dichroic materials of the related art, such as a visible light absorbing material (a dichroic dye), a light emitting material (a fluorescent material or a phosphorescent material), an ultraviolet absorbing material, an infrared absorbing material, a non-linear optical material, a carbon nanotube, and an inorganic material (for example, a quantum rod).

Among these, a compound having a chromophore which is a nucleus of a dichroic material and a side chain bonded to a terminal of the chromophore is preferable.

Specific examples of the chromophore include an aromatic ring group (such as an aromatic hydrocarbon group or an aromatic heterocyclic group) and an azo group. In addition, a structure containing both an aromatic ring group and an azo group is preferable, and a bisazo structure containing an aromatic heterocyclic group (preferably a thienothiazole group) and two azo groups is more preferable.

The side chain is not particularly limited, and examples thereof include a group represented by $R^4$, $R^5$, or $R^6$ in Formula (3).

Suitable examples of the second dichroic material include a dichroic dye compound having a structure represented by Formula (3).

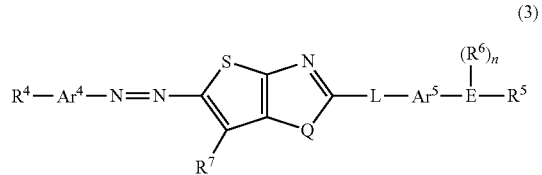

(3)

In Formula (3), $R^4$ and $R^5$ each represent a substituent, and $R^6$ and $R^7$ each independently represent a hydrogen atom or a substituent.

In Formula (3), $Ar^4$ and $Ar^5$ each independently represent a divalent aromatic group which may have a substituent.

In Formula (3), E represents a single bond or any of a nitrogen atom, an oxygen atom, or a sulfur atom.

In Formula (3), Q represents an oxygen atom or a sulfur atom.

In Formula (3), L represents a single bond, —N=N—, —CR=N—, —CR=CR'—, or —C(=O)—NR—. R and R' each independently represent a hydrogen atom, a halogen atom, a cyano group, a nitro group, or an alkyl group having 1 to 6 carbon atoms.

In Formula (3), n represents 0 or Here, n represents 0 in a case where E represents a single bond or any of an oxygen atom or a sulfur atom, and n represents 1 in a case where E represents a nitrogen atom.

The "substituent" represented by $R^4$ and $R^5$ in Formula (3) will be described.

Examples of the substituent include a group having an electron-donating property or an electron-withdrawing property which is to be introduced to adjust the color tone of the dye and a group containing a crosslinkable group (polymerizable group) which is to be introduced to fix the alignment.

Examples of the substituent represented by $R^4$ include the same groups as those for $R^1$ in Formula (2).

Examples of the substituent represented by $R^5$ include an alkyl group which may be substituted.

Suitable examples of the alkyl group include an alkyl group having 1 to 20 carbon atoms.

Here, the carbon atoms constituting the alkyl group may be substituted with —O—, —CO—, —C(O)—O—, —O—C(O)—, —Si(CH$_3$)$_2$—O—Si(CH$_3$)$_2$—, —N(R)—, —N(R)—CO—, —CO—N(R)—, —N(R)—C(O)—O—, —O—C(O)—N(R)—, —N(R)—C(O)—N(R')—, —N=N—, —C(R)=N—, —C(R)=CH—C(O)—, or —O—C(O)—O—. R and R' represent an alkyl group and preferably an alkyl group having 1 to 10 carbon atoms.

The hydrogen atom bonded to the carbon atom of the alkyl group may be substituted with a halogen atom, a nitro group, a cyano group, —N(R)(R')—, an amino group, —C(R)=C(R')—NO$_2$, —C(R)=C(R')—CN, or —C(R)=C(CN)$_2$. R and R' represent an alkyl group and preferably an alkyl group having 1 to 10 carbon atoms.

The "hydrogen atom or substituent" represented by Rb and $R^7$ in Formula (3) will be described.

Here, examples of the "substituent" represented by $R^6$ and $R^7$ in one embodiment include those for the "substituent" represented by $R^5$ in Formula (3). In a case where $R^6$ represents a substituent, $R^6$ may be linked to $R^5$ to form a ring structure.

The "divalent aromatic group which may have a substituent" by $Ar^4$ and $Ar^5$ in Formula (3) will be described.

Examples of the substituent include the substituent group G described in paragraphs [0237] to [0240] of JP2011-237513A. Among these, a halogen atom, an alkyl group, an alkoxy group, an alkoxycarbonyl group (such as methoxycarbonyl or ethoxycarbonyl), and an aryloxycarbonyl group (such as phenoxycarbonyl, 4-methylphenoxycarbonyl, or 4-methoxyphenylcarbonyl) are suitable, an alkyl group is more suitable, and an alkyl group having 1 to 5 carbon atoms is still more suitable.

Meanwhile, examples of the divalent aromatic group include a divalent aromatic hydrocarbon group and a divalent aromatic heterocyclic group.

Examples of the divalent aromatic hydrocarbon group include an arylene group having 6 to 12 carbon atoms, and specific examples thereof include a phenylene group, a cumenylene group, a mesitylene group, a tolylene group, and a xylylene group. Among these, a phenylene group is preferable.

Further, a group derived from a monocycle or a bicyclic heterocycle is preferable as the divalent aromatic heterocyclic group. Examples of atoms other than the carbon atoms constituting the aromatic heterocyclic group include a nitrogen atom, a sulfur atom, and an oxygen atom. In a case where the aromatic heterocyclic group has a plurality of atoms constituting a ring other than carbon, these may be the same as or different from each other. Specific examples of the aromatic heterocyclic group include a pyridylene group (pyridine-diyl group), a quinolylene group (quinoline-diyl group), an isoquinolyiene group (isoquinolin-diyl group), a benzothiadiazole-diyl group, a phthalimido-diel group, and a thienothiazole-diyl group (hereinafter, also referred to as a "thienothiazole group").

Among the divalent aromatic groups described above, a divalent aromatic hydrocarbon group is preferable.

In Formula (3), as described above, E represents a single bond or any of a nitrogen atom, an oxygen atom, or a sulfur atom and preferably a single bond or a nitrogen atom.

In Formula (3), as described above, Q represents an oxygen atom or a sulfur atom and preferably a sulfur atom.

In Formula (3), as described above, L represents a single bond, —N═N—, —CR═N—, —CR═CR'—, or —C(═O)—NR—, and R and R' each independently represent a hydrogen atom, a halogen atom, a cyano group, a nitro group, or an alkyl group having 1 to 6 carbon atoms. Among these, —N═N— or —C(═O)—NH— is preferable.

Specific examples of the dichroic dye compound having a structure represented by Formula (3) are shown below, but the invention is not limited thereto.

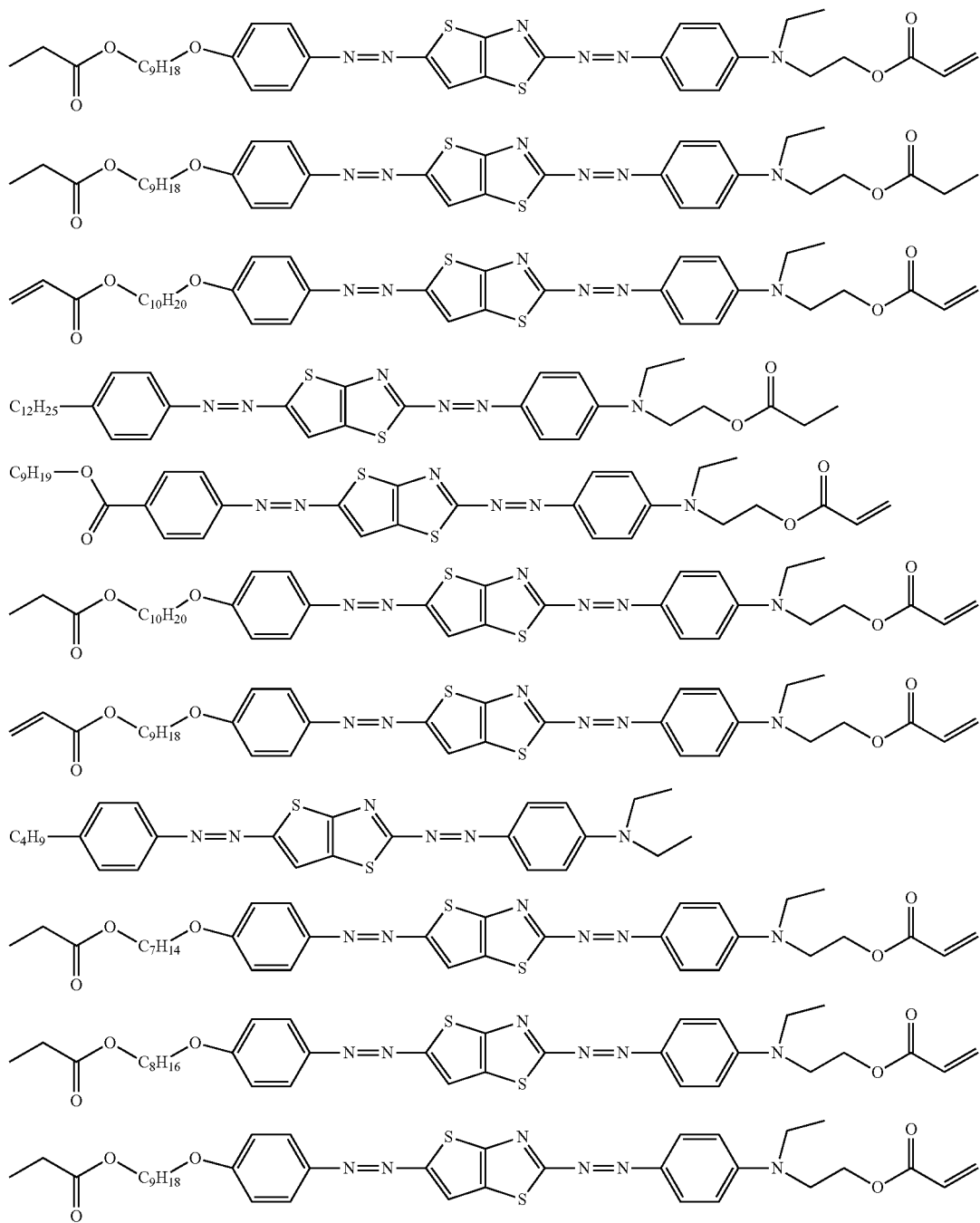

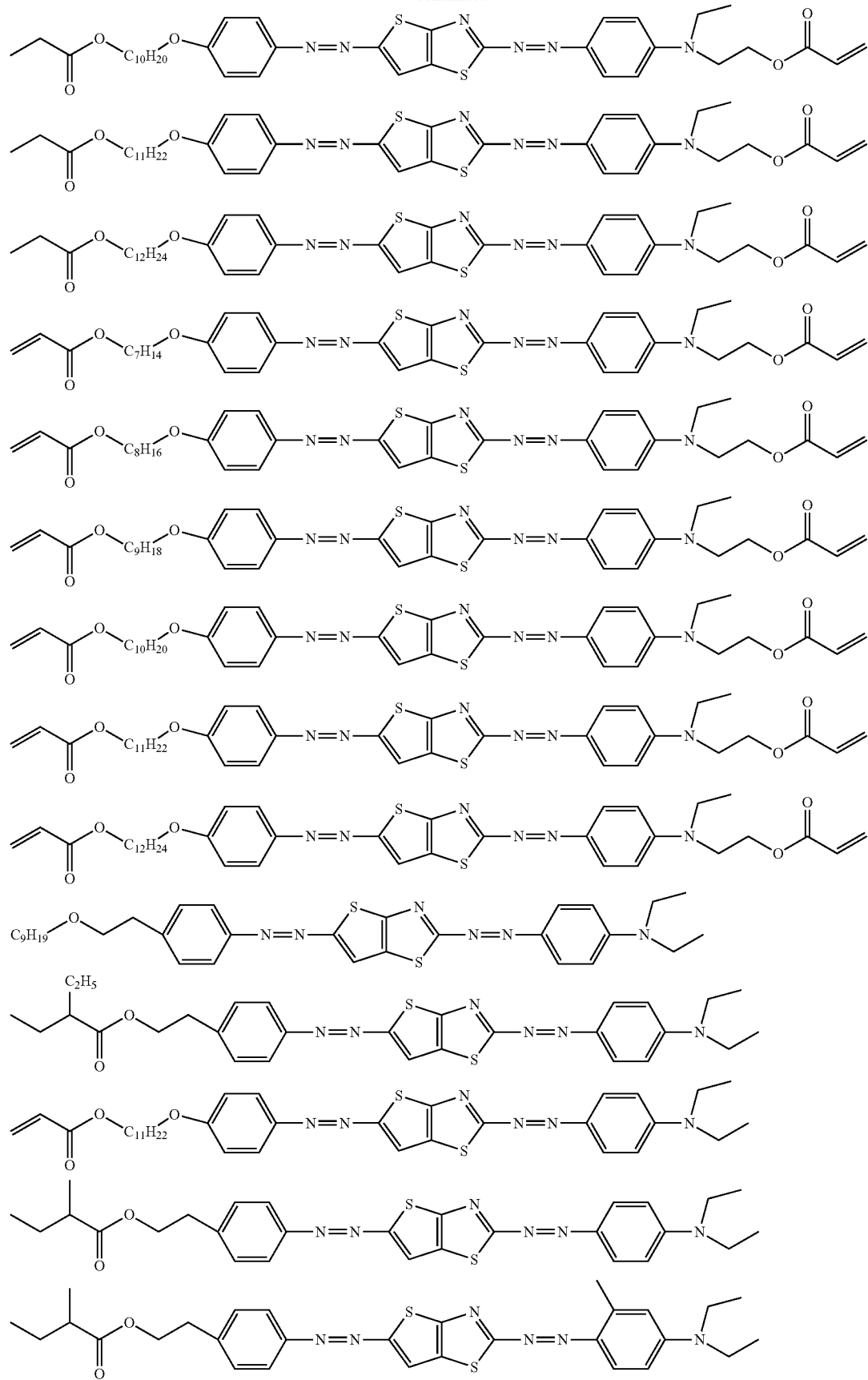

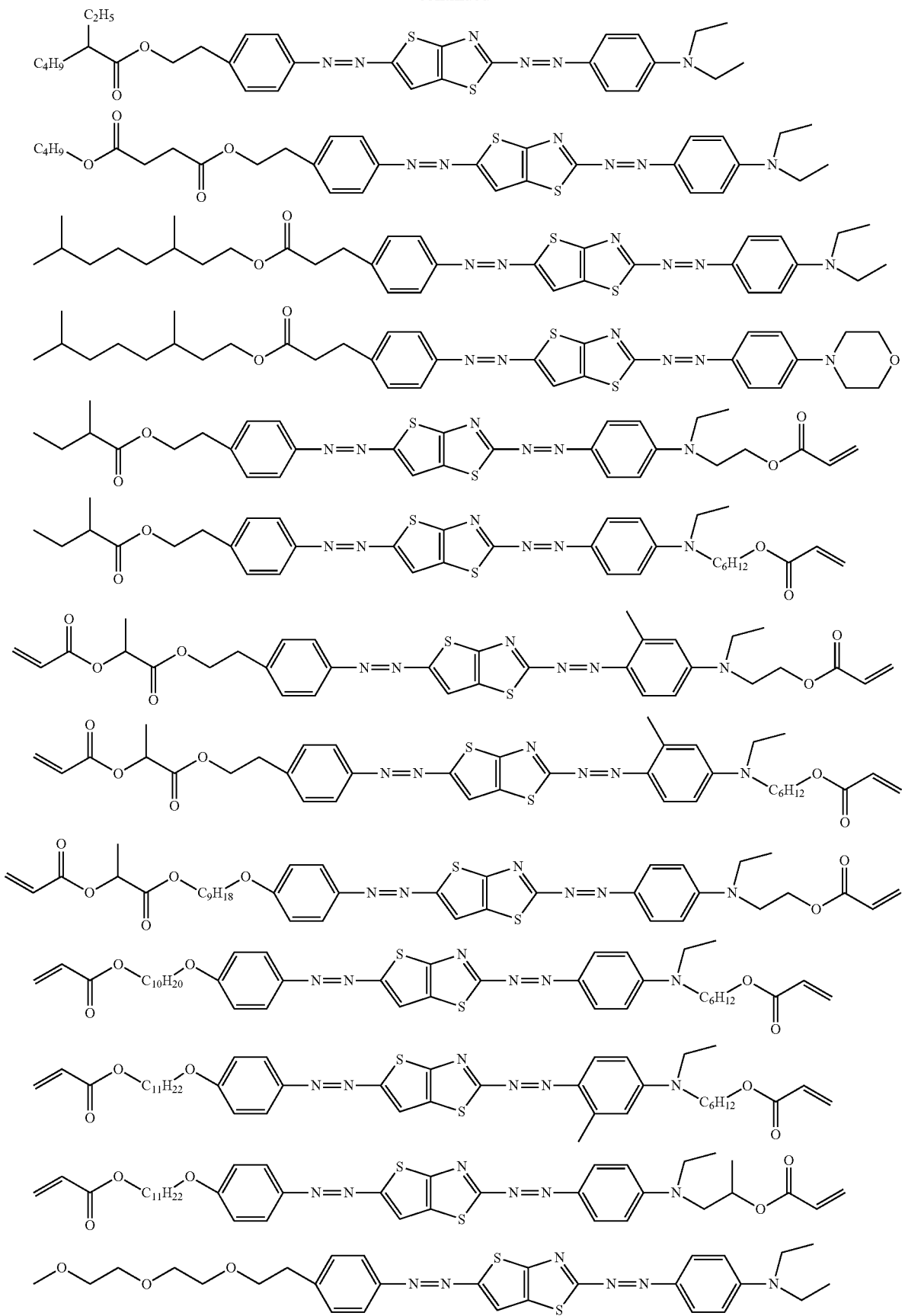

-continued

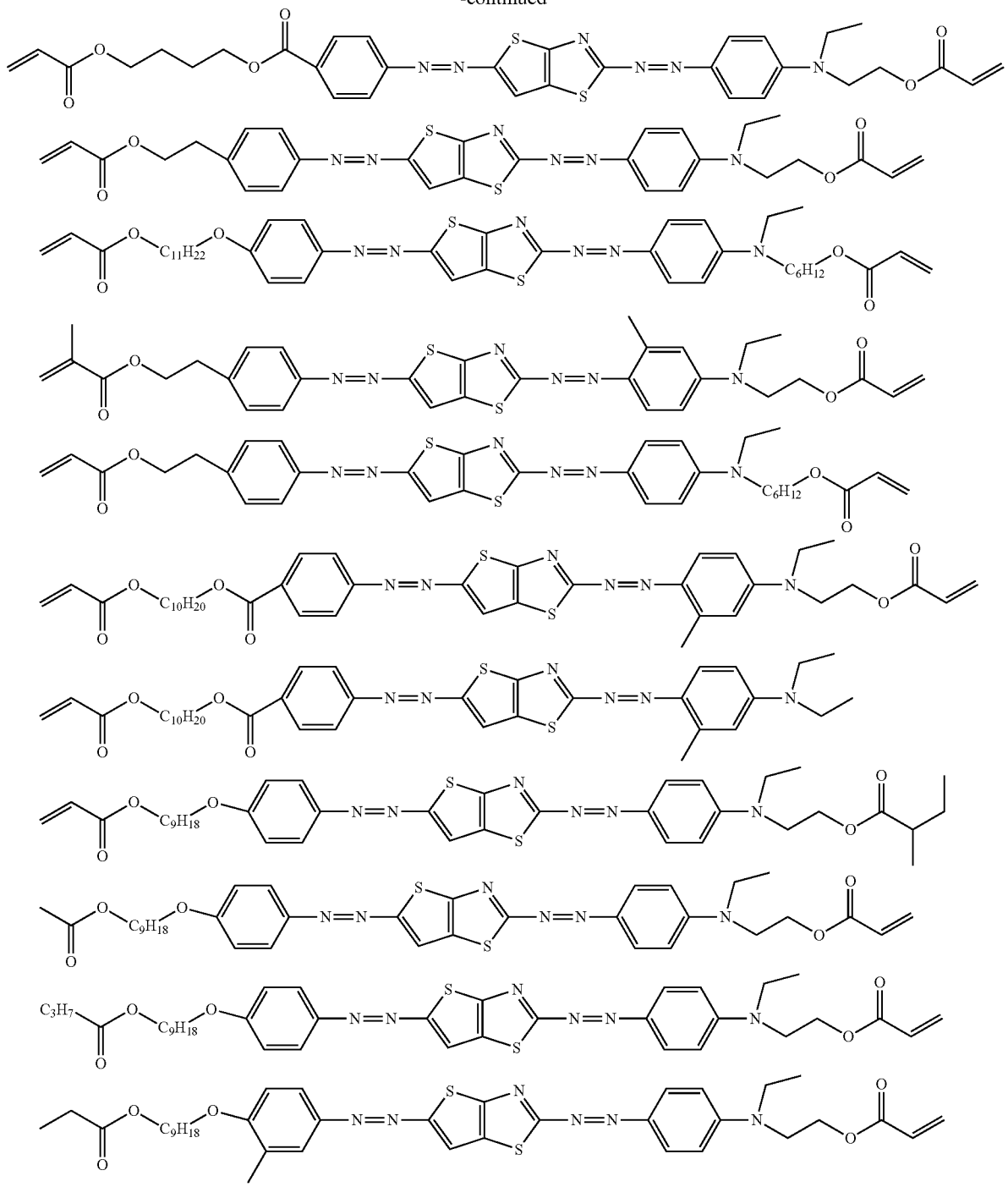

In the present invention, from the viewpoint of adjusting the tint of the polarizer, a dichroic material having a maximum absorption wavelength in a range of 560 nm to 700 nm is preferable, a dichroic material having a maximum absorption wavelength in a range of 560 to 650 nm is more preferable, and a dichroic material having a maximum absorption wavelength in a range of 560 to 640 nm is still more preferable as the second dichroic material.

Further, in the present invention, from the viewpoint of easily forming the second array structure, the difference between the log P value of the second dichroic material and the log P value of the liquid crystal compound described above is preferably 4.3 or greater and more preferably 5.4 or greater.

From the same viewpoint as described above, the log P value of the second dichroic material is preferably 8 or greater and more preferably 10 or greater.

(Difference in Log P Value)

In the present invention, from the viewpoint of easily forming the first array structure and the second array structure, a difference between the log P value of a side chain of the first dichroic material and the log P value of a side chain of the second dichroic material (hereinafter, also referred to as a "difference in log P value between side chains") is preferably 1.1 or greater and more preferably 1.3 or greater.

Further, in a case where the first dichroic material or the second dichroic material has a plurality of side chains, it is preferable that at least one difference in log P value between side chains satisfies the above-described value.

Here, the side chains of the first dichroic material and the second dichroic material indicate groups bonded to the terminal of the chromophore described above. For example, $R^1$, $R^2$, and $R^3$ in Formula (2) are side chains in a case where the first dichroic material is a compound represented by Formula (2) and $R^4$, $R^5$, and $R^6$ in Formula (3) are side chains in a case where the second dichroic material is a compound represented by Formula (3). In particular, in a case where the first dichroic material is a compound represented by Formula (2) and the second dichroic material is a compound represented by Formula (3), it is preferable that at least one difference in log P value from among a difference in log P value between $R^1$ and $R^4$, a difference in log P value between $R^1$ and $R^5$, a difference in log value between $R^2$ and $R^4$, or a difference in log P value between $R^3$ and $R^4$ satisfies the above-described value.

<Third Dichroic Material>

It is preferable that the present composition contains a third dichroic material different from the first dichroic material and the second dichroic material described above.

In the present invention, from the viewpoint of adjusting the tint of the polarizer, dichroic material having a maximum absorption wavelength in a range of 380 nm or greater and less than 455 nm is preferable, and a dichroic material having a maximum absorption wavelength in a range of 385 to 454 nm is more preferable as the third dichroic material.

Specific examples of the third dichroic material include compounds other than the first dichroic material and the second dichroic material among the compounds represented by Formula (1) described in WO2017/195833A.

<Content of Dichroic Material>

The content of the dichroic materials in the present composition is preferably in a range of 0.1 to 99 parts by mass, more preferably in a range of 1 to 60 parts by mass, and particularly preferably in a range of 1.5 to 30 parts by mass with respect to 100 parts by mass which is the total amount of the dichroic materials and the liquid crystal compound.

The content of the first dichroic material is preferably in a range of 6 to 50 parts by mass and more preferably in a range of 8 to 45 parts by mass with respect to 100 parts by mass which is the content of the dichroic materials in the present composition.

The content of the second dichroic material is preferably in a range of 40 to 90 parts by mass and more preferably in a range of 55 to 85 parts by mass with respect to 100 parts by mass which is the content of the dichroic materials in the present composition.

In a case where the present composition contains a third dichroic material, the content of the third dichroic material is preferably in a range of 3 to 40 parts by mass and more preferably in a range of 5 to 35 parts by mass with respect to 100 parts by mass which is the content of the dichroic materials in the present composition.

<Solvent>

From the viewpoint of workability and the like, it is preferable that the present composition contains a solvent.

Examples of the solvent include organic solvents such as ketones (such as acetone, 2-butanone, methyl isobutyl ketone, cyclopentanone, and cyclohexanone), ethers (such as dioxane, tetrahydrofuran, tetrahydropyran, dioxolane, tetrahydrofurfuryl alcohol, and cyclopentyl methyl ether), aliphatic hydrocarbons (such as hexane), alicyclic hydrocarbons (such as cyclohexane), aromatic hydrocarbons (such as benzene, toluene, xylene, and trimethylbenzene), halogenated carbons (such as dichloromethane, trichloromethane (chloroform), dichloroethane, dichlorobenzene, and chlorotoluene), esters (such as methyl acetate, ethyl acetate, butyl acetate, and diethyl carbonate), alcohols (such as ethanol, isopropanol, butanol, and cyclohexanol), cellosolves (such as methyl cellosolve, ethyl cellosolve, and 1,2-dimethoxyethane), cellosolve acetates, sulfoxides (such as dimethyl sulfoxide), amides (such as dimethylformamide, dimethylacetamide, N-methylpyrrolidone, N-ethylpyrrolidone, and 1,3-dimethyl-2-imidazolidinone), and heterocyclic compounds (such as pyridine), and water. These solvents may be used alone or in combination of two or more kinds thereof.

Among these solvents, it is preferable to use an organic solvent and more preferable to use halogenated carbons or ketones from the viewpoint that the effects of the present invention are more excellent.

In a case where the present composition contains a solvent, the content of the solvent is preferably in a range of 70% to 99.5% by mass, more preferably in a range of 80% to 99% by mass, and still more preferably in a range of 85% to 98% by mass with respect to the total mass of the present composition from the viewpoint that the effects of the present invention are more excellent.

<Interface Modifier>

It is preferable that the present composition contains an interface modifier. In a case where the composition contains an interface modifier, the smoothness of the coated surface is improved, the degree of alignment is improved, and cissing and unevenness are suppressed so that the in-plane uniformity is expected to be improved.

As the interface modifier, interface modifiers that allow liquid crystal compounds to be horizontally aligned are preferable, and compounds (horizontal alignment agents) described in paragraphs [0253] to [0293] of JP2011-237513A can be used. Further, fluorine (meth)acrylate-based polymers described in [0018] to [0043] of JP2007-272185A can also be used. Compounds other than the compounds described above may be used as the interface modifier.

In a case where the present composition of the present invention contains an interface modifier, from the viewpoint that the effects of the present invention are more excellent, the content of the interface modifier is preferably in a range of 0.001 to 5 parts by mass and more preferably in a range of 0.01 to 3 parts by mass with respect to 100 parts by mass which is the total amount of the liquid crystal compound and the dichroic materials in the present composition.

<Polymerization Initiator>

From the viewpoint that the effects of the present invention are more excellent, it is preferable that the present composition contains a polymerization initiator.

The polymerization initiator is not particularly limited, but a compound having photosensitivity, that is, a photopolymerization initiator is preferable.

As the photopolymerization initiator, various compounds can be used without any particular limitation. Examples of the photopolymerization initiator include α-carbonyl compounds (U.S. Pat. Nos. 2,367,661A and 2,367,670A), acyloin ether (U.S. Pat. No. 2,448,828A), α-hydrocarbon-substituted aromatic acyloin compounds (U.S. Pat. No. 2,722,512A), polynuclear quinone compounds (US3046127A and U.S. Pat. No. 2,951,758A), a combination of a triarylimidazole dimer and a p-aminophenyl ketone (U.S. Pat. No.

3,549,367A), acridine and phenazine compounds (JP1985-105667A (JP-S60-105667A) and U.S. Pat. No. 4,239,850A), oxadiazole compounds (11S4212970A), and acylphosphine oxide compounds (JP1988-040799B (JP-S63-040799B), JP1993-029234B (JP-H05-029234B), JP1998-095788A (JP-H10-095788A), and JP1998-029997A (JP10-029997A)).

Commercially available products can also be used as such a photopolymerization initiator, and examples thereof include IRGACURE 184, IRGACURE 907, IRGACURE 369, IRGACURE 651, IRGACURE 819, and IRGACURE OXE-01 (all manufactured by BASE SE).

In a case where the present composition contains a polymerization initiator, from the viewpoint that the effects of the present invention are more excellent, the content of the polymerization initiator is preferably in a range of 0.01 to 30 parts by mass and more preferably in a range of 0.1 to 1.5 parts by mass with respect to 101) parts by mass which is the total amount of the liquid crystal compound and the dichroic materials in the present composition. The durability of the polarizer is excellent in a case where the content of the polymerization initiator is 0.01 parts by mass or greater, and the alignment of the polarizer is more excellent in a case where the content of the polymerization initiator is 30 parts by mass or less.

<Substituent>

The substituent in the present specification will be described.

Examples of the substituent include an alkyl group (preferably an alkyl group having 1 to 20 carbon atoms, more preferably an alkyl group having 1 to 12 carbon atoms, and particularly preferably an alkyl group having 1 to 8 carbon atoms, and examples thereof a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms, and examples thereof include a vinyl group, an aryl group, a 2-butenyl group, and a 3-pentenyl group), an alkynyl group (preferably an alkynyl group having 2 to 20 carbon atoms, more preferably an alkynyl group 2 to 12 carbon atoms, and particularly preferably an alkynyl group having 2 to 8 carbon atoms, and examples thereof include a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms, and examples thereof include a phenyl group, a 2,6-diethylphenyl group, a 3,5-ditrifluoromethylphenyl group, a styryl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms, and examples thereof include an unsubstituted amino group, a methylamino group, a dimethylamino group, a diethylamino group, and an anilino group), an alkoxy group (preferably an alkoxy group having 1 to 20 carbon atoms and more preferably an alkoxy group having 1 to 15 carbon atoms, and examples thereof include a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10 carbon atoms, and examples thereof include a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms, and examples thereof include an acetoxy group, a benzoyloxy group, an acryloyl group, and a methacryloyl group), an acylamino group (preferably an acylamino group having 2 to 20 carbon atoms, more preferably an acylamino group having 2 to 10 carbon atoms, and particularly preferably an acylamino group having 2 to 6 carbon atoms, and examples thereof include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms, and examples thereof include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms, and examples thereof include a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms, and examples thereof include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms, and examples thereof include a sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms, and examples thereof include an unsubstituted carbamoyl group, a methylcarbamoyl group, a diethylcarbartioyl group, and a phenylcarbamoyl group), an alkyithio group (preferably an alkylthio group having 1 to 20 carbon atoms, more preferably an alkylthio group having 1 to 10 carbon atoms, and particularly preferably an alkylthio group having 1 to 6 carbon atoms, and examples thereof include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms, and examples thereof include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms, and examples thereof include a mesyl group and a tosyl group), a sulfinyl group (preferably a sulfinyl group having 1 to 20 carbon atoms, more preferably a sulfonyl group having 1 to 10 carbon atoms, and particularly preferably a sulfinyl group having 1 to 6 carbon atoms, and examples thereof include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms, and examples thereof include an unsubstituted ureido group, a methylureido group, and a phenylureido group), a phosphoric acid amide group (preferably a phosphoric acid amide group having 1 to 20 carbon atoms, more preferably a phosphoric acid amide group having 1 to 10 carbon atoms, and particularly preferably a phosphoric acid amide group having 1 to 6 carbon atoms, and examples thereof include a diethylphosphoric acid amide group and a phenylphosphoric acid amide group), a hydroxy group, a mercapto group, a halogen atom (such as a fluorine atom, a chlorine atom, a bromine atom, and an iodine atom), a cyano group, a nitro group, a hydroxamic acid group, a sulfinol group, a hydrazino group, an imino group, an azo group, a heterocyclic group (preferably a heterocyclic group having 1 to 30 carbon atoms and more preferably a heterocyclic group having 1 to 12 carbon atoms, and examples thereof include a heterocyclic group having a heteroatom such as a nitrogen atom, an oxygen atom, or a sulfur atom, and examples of the heterocyclic group having a heteroatom include an epoxy group, an oxetanyl group, an imidazolyl group, a pyridyl group, a quinolyl group, a furyl group, a piperidyl group, a morpholino group, a maleimide group, a benzoxazolyl group, a benzimidazolyl group, and a benzthiazolyl group), a silyl group (preferably a silyl group having 3 to 40 carbon atoms, more preferably a silyl group having 3 to 30 carbon atoms, and particularly preferably a silyl group having 3 to 24 carbon atoms, and examples thereof include a trimethylsilyl group and a triphenylsilyl group), a carboxy group, a sulfonic acid group, and a phosphoric acid group.

[Associate in Polarizer]

In the present invention, from the viewpoints of further improving the degree of alignment of the polarizer and the light fastness and easily adjusting the tint of the polarizer, it is preferable that the first dichroic material forms an associate in the array structure (first array structure) formed of the first dichroic material and the second dichroic material forms an associate in the array structure (second array structure) formed of the second dichroic material.

Here, as a method of verifying that the first dichroic material forms an associate in the first array structure, a method based on the maximum absorption wavelength measured using a film formed in the following manner is exemplified.

In the production of each film (polarizer), it should be noted that the kinds of underlayers (for example, substrates), the concentrations of compositions, and the conditions for applying the compositions are set to be uniform except that the kind of the dichroic material to be contained in each film is changed, to obtain the same areas of the films and the same film thicknesses.

Specifically, the present composition containing the first dichroic material, the second dichroic material, and the liquid crystal compound is cast on a substrate (for example, blue plate glass), and the composition is heated on a hot plate until the composition enters a liquid crystal state and cooled to room temperature to form a film 1 (corresponding to the polarizer according to the embodiment of the invention). Further, the absorption spectrum of the film 1 is measured at a pitch of 1 nm in a wavelength range of 380 to 800 nm.

Further, a film 1-2 is formed by the same method as described above except that a composition that contains the second dichroic material and the liquid crystal compound but does not contain the first dichroic material is used. Further, the absorption spectrum of the film 1-2 is measured at a pitch of 1 urn in a wavelength range of 380 to 800 nm.

Further, the difference spectrum is acquired by subtracting the absorption spectrum of the film 1-2 from the absorption spectrum of the film 1, and a maximum absorption wavelength of the obtained difference spectrum is acquired.

In addition, a film 1-1 is formed by the same method as described above except that a composition that contains the first dichroic material and the liquid crystal compound but does not contain the second dichroic material is used. Further, the absorption spectrum of the film 1-1 is measured at a pitch of 1 nm in a wavelength range of 380 to 800 nm to measure a maximum absorption wavelength $\lambda 1$.

Further, a maximum absorption wavelength $\lambda 1'$ in the absorption spectrum of the solution in which the first dichroic material is dissolved is acquired.

Next, in a case where the maximum absorption wavelength $\lambda M$, the maximum absorption wavelength $\lambda 1$, and the maximum absorption wavelength $\lambda 1'$ described above satisfy Formulae (I) and (II), it can be confirmed that the first dichroic material forms an associate based on the following reason.

$$|\lambda M - \lambda 1| \leq 5 \text{ nm} \qquad (I)$$

$$|\lambda 1 - \lambda 1'| \geq 5 \text{ nm} \qquad (II)$$

That is, the difference in composition between the film 1 and the film 1-2 is the presence or absence of the first dichroic material. Therefore, it is expected that the difference spectrum between the absorption spectrum of the film 1 and the absorption spectrum of the film 1-2 is substantially the same as the absorption spectrum derived from the first dichroic material.

Therefore, in a case where the maximum absorption wavelength $\lambda M$ of the difference spectrum and the maximum absorption wavelength XI of the absorption spectrum of the film 1-1 satisfy Formula (I), it can be said that the first dichroic material is present in the film 1 (polarizer) without being incorporated into the second dichroic material.

Meanwhile, since the absorption spectrum of the solution in which the first dichroic material is dissolved is understood as the absorption spectrum of one molecule of the first dichroic material, in a case where the maximum absorption wavelength $\lambda 1'$ of the absorption spectrum and the maximum absorption wavelength $\lambda 1$ of the absorption spectrum of the film 1-1 satisfy Formula (H), it can be said that the maximum absorption wavelength shifts due to the association of the first dichroic materials in the film 1-1.

Therefore, in a case where Formulae (I) and (II) are satisfied, it can be said that the first dichroic materials form an associate without an interaction between the first dichroic material and the second dichroic material.

As a method of verifying that the second dichroic material forms an associate in the second array structure, a method based on the maximum absorption wavelength measured using a film formed in the following manner is exemplified.

In the production of each film (polarizer), it should be noted that the kinds of underlayers (for example, substrates), the concentrations of compositions, and the conditions for applying the compositions are set to be uniform except that the kind of the dichroic material to be contained in each film is changed, to obtain the same areas of the films and the same film thicknesses.

Specifically, the present composition containing the first dichroic material, the second dichroic material, and the liquid crystal compound is cast on a substrate (for example, blue plate glass), and the composition is heated on a hot plate until the composition enters a liquid crystal state and cooled to room temperature to form a film 1 (corresponding to the polarizer according to the embodiment of the invention). Further, the absorption spectrum of the film 1 is measured at a pitch of 1 nm in a wavelength range of 380 to 800 nm.

In addition, a film 1-1 is formed by the same method as described above except that a composition that contains the first dichroic material and the liquid crystal compound but does not contain the second dichroic material is used. Further, the absorption spectrum of the film 1-1 is measured at a pitch of 1 nm in a wavelength range of 380 to 800 nm.

Next, the difference spectrum is acquired by subtracting the absorption spectrum of the film 1-1 from the absorption spectrum of the film 1, and a maximum absorption wavelength $\lambda C$. of the obtained difference spectrum is acquired.

Further, a film 1-2 is formed by the same method as described above except that a composition that contains the second dichroic material and the liquid crystal compound but does not contain the first dichroic material is used. Further, the absorption spectrum of the film 1-2 is measured at a pitch of 1 nm in a wavelength range of 380 to 800 nm to measure a maximum absorption wavelength U.

Further, a maximum absorption wavelength $\lambda 2''$ in the absorption spectrum of the solution in which the second dichroic material is dissolved is acquired.

Next, in a case where the maximum absorption wavelength $\lambda C$, the maximum absorption wavelength $\lambda 2$, and the maximum absorption wavelength $\lambda 2'$ described above satisfy Formulae (III) and (IV), it can be confirmed that the second dichroic material forms an associate based on the following reason.

$$|\lambda C - \lambda 2| \leq 5 \text{ nm} \quad \text{(III)}$$

$$|\lambda 2 - \lambda 2'| \geq 5 \text{ nm} \quad \text{(IV)}$$

That is, the difference in composition between the film 1 and the film 1-1 is the presence or absence of the second dichroic material. Therefore, it is expected that the difference spectrum between the absorption spectrum of the film 1 and the absorption spectrum of the film 1-1 is substantially the same as the absorption spectrum derived from the second dichroic material.

Therefore, in a case where the maximum absorption wavelength $\lambda C$ of the difference spectrum and the maximum absorption wavelength $\lambda 2$ of the absorption spectrum of the film 1-2 satisfy Formula (III), it can be said that the second dichroic material is present in the film 1 (polarizer) without being incorporated into the first dichroic material.

Meanwhile, since the absorption spectrum of the solution in which the second dichroic material is dissolved is understood as the absorption spectrum of one molecule of the second dichroic material, in a case where the maximum absorption wavelength $\lambda 2'$ of the absorption spectrum and the maximum absorption wavelength $\lambda 2$ of the absorption spectrum of the film 1-2 satisfy Formula (IV), it can be said that the maximum absorption wavelength shifts due to the association of the second dichroic materials in the film 1-2.

Therefore, in a case where Formulae (III) and (IV) are satisfied, it can be said that the second dichroic materials form an associate without an interaction between the second dichroic material and the first dichroic material.

[Crystal Structure in Polarizer]

In the present invention, from the viewpoints of further improving the degree of alignment of the polarizer and the light fastness and easily adjusting the tint of the polarizer, it is preferable that the first dichroic material forms a crystal structure in the array structure (first array structure) formed of the first dichroic material and the second dichroic material forms a crystal structure in the array structure (second array structure) formed of the second dichroic material.

Here, the fact that the first dichroic material forms a crystal structure in the first array structure and the second dichroic material forms a crystal structure in the second array structure can be confirmed by comparing the X-ray diffraction (XRD) spectra of the polarizers (films) described below.

Polarizer 1 (film 1): a film formed of a composition containing the first dichroic material, the second dichroic material, and the liquid crystal compound Polarizer 1-1 (film 1-1): a film formed of a composition that contains the first dichroic material and the liquid crystal compound but does not contain the second dichroic material Polarizer 1-2 (film 1-2): a film formed of a composition that contains the second dichroic material and the liquid crystal compound but does not contain the first dichroic material Polarizer 1-3 (film 1-3): a film formed of a composition that contains the liquid crystal compound but does not contain the first dichroic material and the second dichroic material <Preparation of Polarizer>

The above-described polarizer is prepared by the same method as described above. For example, it should be noted that the concentrations of the coating solutions and the conditions for applying the coating solutions are set to be uniform to obtain the same areas of the films and the same film thicknesses.

The method of preparing the above-described polarizer is not particularly limited as long as the same method as described above is used. However, in a case where the polarizer 1 (film 1) contains an interface modifier, the other polarizer is set as a film containing the same amount of the interface modifier as that in the polarizer 1.

<XRD Measurement>

XRD measurement is performed on the above-described polarizer under the same conditions (for example, the film thicknesses, the measurement areas, and the measurement conditions are set to be uniform) as described above.

For example, XRD measurement is performed as follows.

X-ray diffraction analysis is performed on each polarizer using an in-plane method. Hereinafter, the X-ray diffraction analysis performed using an in-plane method is also described as "in-plane XRD", The in-plane XRD is performed by irradiating the surface of the polarizer layer with X-rays using a thin film X-ray diffractometer under the following conditions. Further, an angle in a state where the polarizer is disposed such that the incident direction of X-rays and the direction in which the liquid crystal compound and the dichroic material are aligned in a major axis direction are parallel to each other is set as an azimuthal angle ($\varphi$) of 0°, and in-plane XRD is performed in all directions for every 15°, and the orientation in the substrate plane where the peak intensity is the maximum is determined by $\varphi$ scan performed with respect to the observed peak. XRD spectra described below are compared using the spectra for in-plane measurement in the obtained orientation. For the peak intensity, a value standardized as a film thickness corresponding to the X-ray penetration length at an X-ray incidence angle of 0.2" is used.

(Conditions)

Cu ray source to be used (CuKα, output of 45 kV, 200 mA)

X-ray incidence ample of 0.20

Optical system to be used: parallel optical system (cross beam optics (CBO)) (parallel beam (PB))

Incident side, incident slit having a width of 0.2 mm, incident parallel slit in-plane parallel slit collimator (PSC) at 0.5 degrees (deg), longitudinal limit slit having a width of 10 mm Light-receiving side, light-receiving slit having a width of 0 turn, light-receiving parallel slit in-plane parallel slit analyzer (NA) at 0.5 deg Detector: HyPix3000 (OD mode) manufactured by Rigaku Corporation $2\theta\chi/\varphi$ Scan, scan conditions: 0.008 degrees/step, 2M degrees/min in a range of 1 to 40 degrees $\varphi$ Scan, scan conditions: 0.5 degree/step, 9.6 degree/min in a range of −120 to 120 degrees The above-described conditions are set values in the thin film X-ray diffractometer.

Further, a known device can be used as the thin film X-ray diffractometer. As an example of the thin film X-ray diffractometer, SmartLab (manufactured by Rigaku Corporation) can be exemplified.

<Comparison of XRD Spectra>

The measured X-ray peaks of the polarizer 1-1, the polarizer 1-2, and the polarizer 1-3 at each angle are compared to each other.

The peak that is present in the polarizer 1-1 hut is not present in the polarizer 1-3 is set as a peak M derived from the crystal structure of the first dichroic material, and the peak that is present in the polarizer 1-2 but is not present in the polarizer 1-3 is set as a peak C derived from the crystal structure of the second dichroic material.

Next, the X-ray peaks of the polarizer 1, the polarizer 1-1, and the polarizer 1-2 at each angle are compared to each other.

In a case where the peak M that is present in the polarizer 1-1 and is derived from the first dichroic material and the peak C that is present in the polarizer 1-2 and is derived from the second dichroic material are seen in the polarizer 1, it is defined that only the first dichroic material thrills a crystal structure and only the second dichroic material forms a crystal structure in the polarizer 1.

From the viewpoint of easily forming the first array structure, it is preferable that the polarizer according to the embodiment of the present invention satisfies Formula (V).

$$0.9 \leq MO/M \leq 1.1 \qquad (V)$$

Here, in Expression (V), MO represents an intensity of a peak derived from a periodic structure of the first dichroic material in an X-ray diffraction spectrum of a film (film 1) formed of a composition that contains the first dichroic material, the second dichroic material, and the liquid crystal compound, and M represents an intensity of a peak derived from a periodic structure of the first dichroic material in an X-ray diffraction spectrum of a film (film 1-1) formed of a composition that contains the first dichroic material and the liquid crystal compound but does not contain the second dichroic material.

From the viewpoint of easily forming the second array structure, it is preferable that the polarizer according to the embodiment of the present invention satisfies Formula (VI).

$$0.9 \leq CO/C \leq 1.1 \qquad (VI)$$

Here, in Expression (VI), CO represents an intensity of a peak derived from a periodic structure of the second dichroic material in an X-ray diffraction spectrum of a film (film 1) formed of a composition that contains the first dichroic material, the second dichroic material, and the liquid crystal compound, and C represents an intensity of a peak derived from a periodic structure of the second dichroic material in an X-ray diffraction spectrum of a film (film 1-2) formed of a composition that contains the second dichroic material and the liquid crystal compound but does not contain the first dichroic material.

[Method of Producing Polarizer]

The method of producing the polarizer according to the embodiment of the present invention is not particularly limited, but a method comprising a step of forming a coating film by coating an alignment film with the above-described present composition (hereinafter, also referred to as a "coating film forming step") and a step of aligning a dichroic material contained in the coating film (hereinafter, also referred to as an "aligning step") in this order (hereinafter, also referred to as the "present production method") is preferable from the viewpoint that the degree of alignment of the polarizer to be obtained is increased.

Hereinafter, each step will be described.

<Coating Film Forming Step>

The coating film forming step is a step of forming a coating film by coating the alignment film with the above-described present composition. The liquid crystal compound in the coating film is horizontally aligned due to an interaction between the alignment film and an interface modifier (in a case where the present composition contains an interface modifier).

The alignment film can be easily coated with the present composition of the present invention by using the composition of the present invention which contains the above-described solvent or using a liquid such as a melt obtained by heating the composition of the present invention.

Examples of the method of coating the film with the present composition include known methods such as a roll coating method, a gravure printing method, a spin coating method, a wire bar coating method, an extrusion coating method, a direct gravure coating method, a reverse gravure coating method, a die coating method, a spraying method, and an ink jet method.

(Alignment Film)

An alignment film may be any film as long as the film allows the liquid crystal compound contained in the present composition to be horizontally aligned.

An alignment film can be provided by means such as a rubbing treatment performed on a film surface of an organic compound (preferably a polymer), oblique vapor deposition of an inorganic compound, formation of a layer having microgrooves, or accumulation of an organic compound (such as ω-tricosanoic acid, dioctadecylmethylammonium chloride, or methyl stearylate) according to a Langmuir-Blodgett method (LB film). Further, an alignment film in which an alignment function is generated by application of an electric field, application of a magnetic field, or irradiation with light is also known. Among these, in the present invention, an alignment film formed by performing a rubbing treatment is preferable from the viewpoint of easily controlling the pretilt angle of the alignment film, and a photo-alignment film formed by irradiation with light is also preferable from the viewpoint of the uniformity of alignment.

(1) Rubbing Treatment Alignment Film

A polymer material used for the alignment film formed by performing a rubbing treatment is described in multiple documents, and a plurality of commercially available products can be used. In the present invention, polyvinyl alcohol or polyimide and derivatives thereof are preferably used. The alignment film can refer to the description on page 43, line 24 to page 49, line 8 of WO2001/88574A1. The thickness of the alignment film is preferably in a range of 0.01 to 10 μm and more preferably in a range of 0.01 to 1 μm.

(2) Photo-Alignment Film

A photo-alignment material used for an alignment film formed by irradiation with light is described in a plurality of documents. In the present invention, preferred examples thereof include azo compounds described in JP2006-285197A, JP2007-076839A, JP2007-138138A JP2007-094071A, JP2007-121721A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadiimide compounds having a photo-alignment unit described in JP2002-265541A and JP2002-317013A, photocrosslinkable silane derivatives described in JP4205195B and JP4205198B, photocrosslinkable polyimides, polyamides, or esters described in JP2003-520878A, JP2004-529220A, and JP4162850B. Among these, azo compounds, photocrosslinkable polyimides, polyamides, or esters are more preferable.

The photo-alignment film formed of the above-described material is irradiated with linearly polarized light or non-polarized light to produce a photo-alignment film.

In this specification, the "irradiation with linearly polarized light" and the "irradiation with non-polarized light" are operations for causing a photoreaction in the photo-alignment material. The wavelength of the light to be used varies depending on the photo-alignment material to be used and is not particularly limited as long as the wavelength is required for the photoreaction. The peak wavelength of light to be used for irradiation with light is preferably in a range of 200 nm to 700 nm, and ultraviolet light having a peak wavelength of 400 nm or less is more preferable.

Examples of the light source used for irradiation with light include commonly used light sources, for example, lamps such as a tungsten lamp, a halogen lamp, a xenon lamp, a xenon flash lamp, a mercury lamp, a mercury xenon lamp, or a carbon arc lamp, various lasers [such as a semiconductor laser, a helium neon laser, an argon ion laser, a helium cadmium laser, and a yttrium aluminum garnet (YAG) laser], a light emitting diode, and a cathode ray tube.

As means for obtaining linearly polarized light, a method of using a polarizing plate (for example, an iodine polarizing plate, a dichroic material polarizing plate, or a wire grid polarizing plate), a method of using a prism-based element (for example, a Glan-Thompson prism) or a reflective type polarizer for which a Brewster's angle is used, or a method of using light emitted from a laser light source having polarized light can be employed. In addition, only light having a required wavelength may be selectively applied using a filter or a wavelength conversion element.

In a case where light to be applied is linearly polarized light, a method of applying light vertically or obliquely to the upper surface with respect to the alignment film or the surface of the alignment film from the rear surface is employed. The incidence angle of light varies depending on the photo-alignment material, but is preferably in a range of 0° to 90° (vertical) and more preferably in a range of 40° to 90°.

In a case where light to be applied is non-polarized light, the alignment film is irradiated with non-polarized light obliquely. The incidence angle is preferably in a range of 100 to 80, more preferably in a range of 20° to 60°, and still more preferably in a range of 30° to 500.

The irradiation time is preferably in a range of 1 minute to 60 minutes and more preferably in a range of 1 minute to 10 minutes.

In a case where patterning is required, a method of performing irradiation with light using a photomask as many times as necessary for pattern preparation or a method of writing a pattern by laser light scanning can be employed.

<Aligning Step>

The aligning step is a step of aligning the dichroic material contained in the coating film. In this manner, the polarizer according to the embodiment of the present invention is obtained. In the aligning step the dichroic material is considered to be aligned along the liquid crystal compound aligned by the alignment film.

The aligning step may include a drying treatment. Components such as a solvent can be removed from the coating film by performing the drying treatment. The drying treatment may be performed according to a method of allowing the coating film to stand at room temperature for a predetermined time (for example, natural drying) or a method of heating the coating film and/or blowing air to the coating film.

Here, the dichroic material contained in the present composition may be aligned by performing the above-described coating film forming step or drying treatment. For example, in an embodiment in which the present composition is prepared as a coating solution containing a solvent, the polarizer according to the embodiment of the present invention may be obtained by drying the coating film and removing the solvent from the coating film so that the dichroic material contained in the coating film is aligned.

It is preferable that the aligning step includes a heat treatment. In this manner, the dichroic material contained in the coating film is further aligned, and the degree of alignment of the polarizer to be obtained is further increased.

From the viewpoint of the manufacturing suitability, the heat treatment is performed at a temperature of preferably 10° C. to 250° C. and more preferably 25° C. to 190° C. Further, the heating time is preferably in a range of 1 to 300 seconds and more preferably in a range of 1 to 60 seconds.

The aligning step may include a cooling treatment performed after the heat treatment.

The cooling treatment is a treatment of cooling the coating film after being heated to room temperature (20° C. to 25° C.). In this manner, the alignment of the dichroic material contained in the coating film is further fixed, and the degree of alignment of the polarizer to be obtained is further increased. The cooling means is not particularly limited and can be performed according to a known method.

The polarizer according to the embodiment of the present invention can be obtained by performing the above-described steps.

<Other Steps>

The production method described below may include a step of curing the polarizer after the aligning step (hereinafter, also referred to as a "curing step").

The curing step is performed by, for example, heating the film and/or irradiating (exposing) the film with light. Between these, it is preferable that the curing step is performed by irradiating the film with light.

Various light sources such as infrared rays, visible light, and ultraviolet rays can be used as the light source for curing, but ultraviolet rays are preferable. In addition, ultraviolet rays may be applied while the film is heated during curing, or ultraviolet rays may be applied through a filter that transmits only a specific wavelength.

Further, the exposure may be performed under a nitrogen atmosphere. In a case where the curing of the polarizer proceeds by radical polymerization, from the viewpoint of reducing inhibition of polymerization by oxygen, it is preferable that exposure is performed in a nitrogen atmosphere.

[Laminate]

The laminate of the present invention includes a base material, an alignment film provided on the base material, and the above-described polarizer according to the embodiment of the present invention provided on the alignment film.

Further, the laminate of the present invention may include a λ/4 plate on the polarizer according to the embodiment of the present invention.

Further, the laminate of the present invention may include a barrier layer between the polarizer according to the embodiment of the present invention and the λ/4 plate.

Hereinafter, each layer constituting the laminate of the present invention will be described.

[Base Material]

The base material can be appropriately selected, and examples thereof include glass and a polymer film. The light transmittance of the base material is preferably 80% or greater.

In a case where a polymer film is used as the base material, it is preferable to use an optically isotropic polymer film. As specific examples and preferred embodiments of the polymer, the description in paragraph [0013] of JP2002-022942A can be applied. Further, even in a case of a polymer easily exhibiting the birefringence such as polycarbonate and polysulfone which has been known in the related art, a polymer with the exhibiting property which has been decreased by modifying the molecules described in WO2000/026705A can be used.

[Alignment Film]

The alignment film is as described above, and thus the description thereof will not be repeated.

[Polarizer]

The polarizer according to the embodiment of the present invention is as described above, and thus the description will not be repeated.

[λ/4 Plate]

A "λ/4 plate" is a plate having a λ/4 function, specifically, a plate having a function of converting linearly polarized light having a specific wavelength into circularly polarized light (or converting circularly polarized light into linearly polarized light).

For example, specific examples of a form in which a λ/4 plate has a single-layer structure include a stretched polymer film and a phase difference film in which an optically anisotropic layer having a λ/4 function is provided on a support. Further, specific examples of a form in which a λ/4 plate has a multilayer structure include a broadband λ/4 plate obtained by laminating a λ/4 plate and a λ/2 plate.

The λ/4 plate and the polarizer according to the embodiment of the present invention may be provided by coming into contact with each other, or another layer may be provided between the λ/4 plate and the polarizer according to the embodiment of the present invention. Examples of such a layer include a pressure sensitive adhesive layer or an adhesive layer for ensuring the adhesiveness, and a barrier layer.

[Barrier Layer]

In a case where the laminate of the present invention comprises a barrier layer, the barrier layer is provided between the polarizer according to the embodiment of the present invention and the λ/4 plate. Further, in a case where a layer other than the barrier layer (for example, a pressure sensitive adhesive layer or an adhesive layer) is comprised between the polarizer according to the embodiment of the present invention and the λ/4 plate, the barrier layer can be provided, for example, between the polarizer according to the embodiment of the present invention and the layer other than the barrier layer.

The barrier layer is also referred to as a gas barrier layer (oxygen barrier layer) and has a function of protecting the polarizer according to the embodiment of the present invention from gas such as oxygen in the atmosphere, the moisture, or the compound contained in an adjacent layer.

The barrier layer can refer to, for example, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A.

[Applications]

The laminate of the present invention can be used as a polarizing element (polarizing plate) or the like, for example, as a linear polarizing plate or a circularly polarizing plate.

In a case where the laminate of the present invention does not include an optically anisotropic layer such as the λ/4 plate, the laminate can be used as a linear polarizing plate.

Meanwhile, in a case where the laminate of the present invention includes the λ/4 plate, the laminate can be used as a circularly polarizing plate.

[Image Display Device]

An image display device according to the embodiment of the present invention includes the above-described polarizer according to the embodiment of the present invention or the above-described laminate of the present invention.

The display element used in the image display device according to the embodiment of the present invention is not particularly limited, and examples thereof include a liquid crystal cell, an organic electroluminescence (hereinafter, abbreviated as "EL") display panel, and a plasma display panel.

Among these, a liquid crystal cell or an organic EL display panel is preferable, and a liquid crystal cell is more preferable. That is, in the image display device of the present invention, a liquid crystal display device obtained by using a liquid crystal cell as a display element or an organic EL display device obtained by using an organic EL display panel as a display element is preferable, and a liquid crystal display device is more preferable.

[Liquid Crystal Display Device]

As a liquid crystal display device which is an example of the image display device according to the embodiment of the present invention, a form of a liquid crystal display device including the above-described polarizer according to the embodiment of the present invention and a liquid crystal cell is preferably exemplified. A liquid crystal display device including the above-described laminate of the present invention (here, the laminate does not include a λ/4 plate) and a liquid crystal cell is more suitable.

In the present invention, between the polarizing elements provided on both sides of the liquid crystal cell, it is preferable that the laminate of the present invention is used as a front-side polarizing element and more preferable that the laminate of the present invention is used as a front-side polarizing element and a rear-side polarizing element.

Hereinafter, the liquid crystal cell constituting the liquid crystal display device will be described in detail.

<Liquid Crystal Cell>

It is preferable that the liquid crystal cell used for the liquid crystal display device is in a vertical alignment (VA) mode, an optically compensated bend (OCB) mode, an in-plane-switching (IPS) mode, or a twisted nematic (TN) mode, but the present invention is not limited thereto.

In the liquid crystal cell in a TN mode, rod-like liquid crystalline molecules are substantially horizontally aligned at the time of no voltage application and further twisted aligned at 60° to 120°. The liquid crystal cell in a TN mode is most likely used as a color thin film transistor (TFT) liquid crystal display device and is described in multiple documents.

In the liquid crystal cell in a VA mode, rod-like liquid crystalline molecules are substantially vertically aligned at the time of no voltage application. The concept of the liquid crystal cell in a VA mode includes (1) a liquid crystal cell in a VA mode in a narrow sense where rod-like liquid crystalline molecules are aligned substantially vertically at the time of no voltage application and substantially horizontally at the time of voltage application (described in JP1990-176625A (JP-H02-176625A)), (2) a liquid crystal cell (in an MVAmode) (SID97, described in Digest of tech. Papers (proceedings) 28 (1997) 845) in which the VA mode is formed to have multi-domain in order to expand the viewing angle, (3) a liquid crystal cell in a mode (n-ASM mode) in which rod-like liquid crystal molecules are substantially vertically aligned at the time of no voltage application and twistedly multi-domain aligned at the time of voltage application (described in proceedings of Japanese Liquid Crystal Conference, p. 58 to 59 (1998)), and (4) a liquid crystal cell in a SURVIVAL mode (presented at LCD International 98). Further, the liquid crystal cell may be of any of a patterned vertical alignment (PVA) type, a photo-alignment type (optical alignment) type, and a polymer-sustained alignment (PSA) type. Details of these modes are described in JP2006-215326A and JP2008-538819A.

In the liquid crystal cell in an IPS mode, rod-like liquid crystal molecules are aligned substantially parallel to the substrate, and the liquid crystal molecules respond planarly through application of an electric field parallel to the substrate surface. In the IPS mode, black display is carried out in a state where no electric field is applied, and absorption axes of a pair of upper and lower polarizing plates are orthogonal to each other. A method of reducing leakage light during black display in an oblique direction and improve the viewing angle using an optical compensation sheet is disclosed in JP998-054982A (JP-H10-054982A), JP1999-202323A (JP-H11-202323A), JP1997-292522A (JP-H9-292522A), JP1999-133408A (JP-H11-133408A), JP1999-305217A (JP-H11-305217A), and JP1998-307291A (JP-H10-307291A).

[Organic EL Display Device]

As an organic EL display device which is an example of the image display device according to the embodiment of the present invention, a form of a display device including the above-described polarizer according to the embodiment of the present invention, a λ/4 plate, and an organic EL display panel in this order from the viewing side is suitably exemplified.

A form of a display device including the above-described laminate of the present invention which includes a λ/4 plate and an organic EL display panel in this order from the viewing side is more suitably exemplified. In this case, the laminate is formed such that a base material, an alignment film, the polarizer according to the embodiment of the present invention, a barrier layer provided as necessary, and a λ/4 plate are disposed in this order from the viewing side.

Further, the organic EL display panel is a display panel formed using an organic EL element having an organic light-emitting layer (organic electroluminescence layer) interposed between electrodes (between a cathode and an anode). The configuration of the organic EL display panel is not particularly limited, and a known configuration is employed.

EXAMPLES

Hereinafter, the present invention will be described in more detail with reference to examples. Materials, used amounts, ratios, treatment contents, treatment procedures, and the like described in the following examples can be appropriately changed without departing from the spirit of the present invention. Therefore, the scope of the present invention should not be limitatively interpreted by the following examples.

Synthesis Example 1

A first dichroic material M1 was synthesized according to the following procedures.

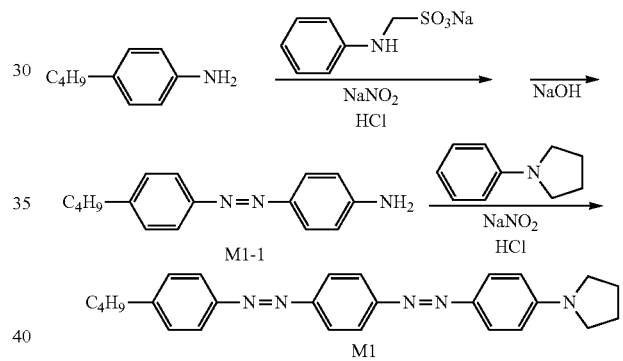

10 g of butylaniline, water (100 mL), methanol (40 mL), and hydrochloric acid (20 mL) were mixed, and sodium nitrite (5.1 g) and water (10 mL) were added thereto while the solution was cooled in an ice bath, and the resulting solution was stirred for 1 hour.

Next, amidosulfuric acid (0.8 g) was further added thereto, and the solution was further stirred for 30 minutes to prepare a reaction solution 1.

An aniline protector X (19.6 g), sodium acetate (22.0 g), water (200 mL), and methanol (50 mL) were mixed, and the solution was cooled in an ice bath. The reaction solution 1 prepared in advance was added dropwise thereto in a state in which the internal temperature was 5° C. or lower, and the solution was stirred at 5° C. or lower for 30 minutes and further stirred at 25° C. for 1 hour.

Thereafter, sodium hydroxide (16.1 g) and water (50 mL) were added thereto, and the solution was heated and stirred at 80° C. for 1 hour. After the solution was cooled, the solid obtained by neutralization with hydrochloric acid was collected by suction filtration, thereby obtaining 3.2 g of a compound M1-1.

The compound M1-1 (2.0 g), water (4 mL), methanol (20 mL), and hydrochloric acid (2.4 mL) were mixed and cooled in an ice bath, sodium nitrite (0.6 g) and water (2 mL) were added thereto, and the solution was stirred for 1 hour. Next, amidosulfuric acid (0.1 g) was further added thereto, and the solution was further stirred for 30 minutes to prepare a reaction solution 2.

Next, 1-phenylpyrrolidine (1.6 g), sodium acetate (2.6 g), water (40 mL), and methanol (40 mL) were mixed and cooled in an ice bath. The reaction solution 1 was added dropwise thereto in a state in which the internal temperature was 5° C. or lower, and the solution was stirred at 5° C. or lower for 30 minutes and further stirred at 25° C. for 1 hour. After the solution was stirred, the obtained solid was collected by suction filtration, thereby obtaining 1.6 g of a first dichroic material M1. Further, $^1$H-NMR (Nuclear Magnetic Resonance) data of the obtained first dichroic material M1 is shown below.

$^1$H-NMR (solvent: CDCl$_3$) δ (ppm): 0.96 (t, 3H), 1.40 (m, 2H), 1.68 (m, 2H), 2.07 (m, 4H), 2.70 (t, 2H), 3.42 (m, 4H), 6.64 (d, 2H), 7.34 (d, 2H), 7.83-8.03 (m, 8H)

Synthesis Example 2

A second dichroic material C1 was synthesized according to the following procedures.

organic layer was dried over magnesium sulfate and then concentrated, thereby obtaining a white solid.

Next, 150 ml of DMAc was added to the solid, and the mixture was stirred in an ice bath. The temperature of the reaction system was maintained at 15° C. or lower, 18.1 g of acrylic acid chloride was added dropwise thereto, and the resulting solution was stirred at room temperature for 1 hour after the dropwise addition. Thereafter, the solution was subjected to liquid separation and then washed using ethyl acetate and further subjected to liquid separation and then washed using a 10% ammonium chloride aqueous solution. Thereafter, the resultant was dried over magnesium sulfate and then concentrated, thereby obtaining a yellow solid C1-1.

Separately, 89.4 g (1.6 mol) of Fe powder, 8.9 g (166 mmol) of ammonium chloride, 210 ml of 2-propanol, and 88 ml of water were mixed and refluxed at an external temperature of 105° C. A yellow solid (A) which had been heated and dissolved in 88 ml of 2-propanol was added dropwise to the refluxed system. After the completion of the dropwise addition, the solution was allowed to react for 30

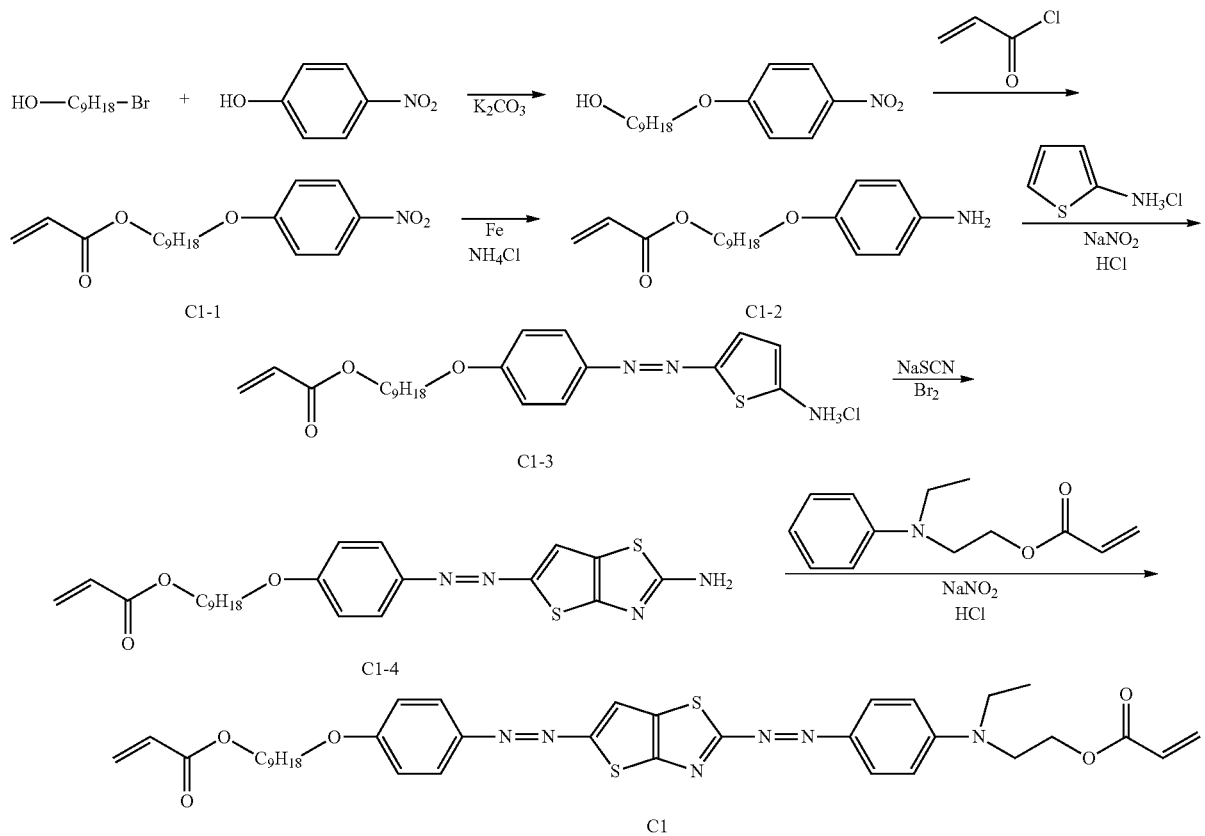

27.8 g of 4-nitrophenol, 44.6 g of 11-bromoundecanol, and 30.4 g of potassium carbonate were dissolved in 150 ml of N,N-dimethylacetamide (DMAc), and the solution was stirred at an external temperature of 105° C. for 2 hours. Thereafter, the temperature was lowered to room temperature (23° C.), and the solution was subjected to liquid separation and then washed using ethyl acetate and further subjected to liquid separation and then washed using a 10% ammonium chloride aqueous solution. Thereafter, the minutes under reflux. The temperature was lowered to room temperature, iron powder was removed by Celite filtration, the filtrate was subjected to liquid separation and washed using ethyl acetate and further subjected to liquid separation and washed using water, and the organic layer was washed with water three times.

The organic layer was dried over sodium sulfate and then concentrated. The resultant was purified by a column, thereby obtaining 8.0 g of a compound C1-2. [0126] 2-Aminothiophene was synthesized by 2-nitrothiophene according to the method described in the literature (Journal of Medicinal Chemistry, 2005, Vol. 48, pp. 5794).

5.5 g of the compound C-2 obtained in the above-described manner was added to a mixed solution of 15 ml of 12 mol/L hydrochloric acid, 30 ml of water, and 30 ml of tetrahydrofuran (THF), the solution was cooled to an internal temperature of 5° C. or lower, and 1.4 g of sodium nitrite was dissolved in 9 ml of water and added dropwise to the solution. The solution was stirred at an internal temperature of 5° C. or lower for 1 hour to prepare a diazonium solution.

Next, 2.4 g of 2-aminothiophene hydrochloride was dissolved in 12 ml of water and 6 ml of hydrochloric acid, and the diazonium solution prepared in the above-described manner was added dropwise at an internal temperature of 0° C. The reaction solution was heated to room temperature and stirred for 2 hours.

The precipitated solid was separated by filtration and dried, thereby obtaining 6.1 g of a reddish orange solid C1-3.

5.6 g of the reddish orange solid C1-3 obtained in the above-described manner was suspended and dissolved in 100 ml of acetic acid, and 1.5 g of sodium thiocyanate was added thereto at room temperature. 2.0 g (24.8 mmol) of bromine was added dropwise thereto while the solution was water-cooled and the internal temperature was maintained at 20° C. or lower.

After the resulting solution was stirred at room temperature for 2 hours, 100 ml of water was added thereto, and the obtained solid was separated by filtration and dried, thereby obtaining 5.5 g of a black solid C1-4.

4.7 g of the black solid C1-4 obtained in the above-described manner was added to 6 ml of hydrochloric acid and 6 ml of acetic acid, 5 ml of an aqueous solution containing 0.72 g of sodium nitrite was added dropwise thereto at 0° C. or lower under ice-cooling, the solution was stirred for 1 hour, and 0.52 mg of amidosulfuric acid was added thereto, thereby obtaining a diazonium solution.

The diazonium solution was added dropwise to a 10 ml methanol solution containing 2.3 g of N-ethyl-N-(2-acryloyloxyethyl)aniline while the methanol solution was maintained at 0° C. or lower. After the solution was heated to room temperature (23° C.) and stirred for 1 hour, 30 ml of water was added thereto, and the obtained solid was separated by filtration. The resultant was purified by a column, thereby obtaining 0.51 g of a second dichroic material C1 as a black purple solid. Further, $^1$H-NMR data of the obtained second dichroic material C1 is shown below.

Further, N-ethyl-N-(2-acryloyloxyethyl)aniline was synthesized using N-ethyl aniline as a raw material according to U.S. Pat. No. 7,601,849B and a known method.

$^1$H-NMR (solvent: CDCl$_3$) S (ppm): 1.20-1.50 (m, 17H), 1.60-1.90 (m, 8H) 3.40 (t, 2H), 3.50 (t, 2H), 4.05 (t, 2H), 4.10 (t, 2H), 4.20 (t, 2H), 5.80-5.85 (d, 2H), 6.10-6.15 (dd, 2H), 6.38-6.43 (d×2, 2H), 6.70 (d, 2H), 7.00 (d, 2H), 7.82 (s, 1H), 7.88 (d, 2H), 7.95 (d, 2H)

Synthesis Example 3

A third dichroic material Y1 was synthesized according to the following procedures.

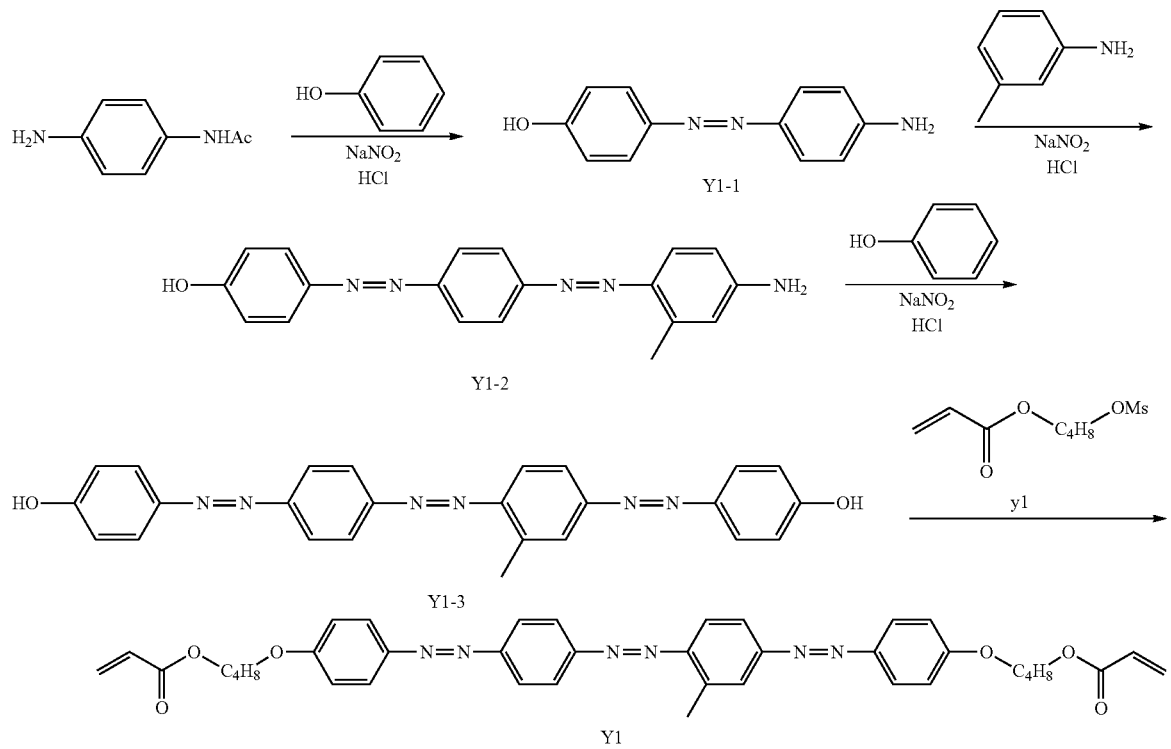

First, 10 g of a compound Y1-1 was synthesized according to the literature (Chem. Eur. J. 2004, 10.2011).

The compound Y1-1 (10 g) was dissolved in water (300 mL) and hydrochloric acid (17 mL), the solution was cooled in an ice bath, sodium nitrite (3.3 g) was added thereto, and the resulting solution was stirred for 30 minutes. Further, m-toluidine (5.1 g) was added thereto after amidosulfuric acid (0.5 g) was further added thereto, and the solution was stirred at room temperature (23° C.) for 1 hour. After the solution was stirred, the solid obtained by neutralization with hydrochloric acid was collected by suction filtration, thereby obtaining 3.2 g of a compound Y1-2.

The compound Y-2 (1.0 g) was dissolved in a THF solution consisting of tetrahydrofuran (30 mL, THF), water (10 mL), and hydrochloric acid (1.6 mL), the solution was cooled in an ice bath, sodium nitrite (0.3 g) was added thereto, the resulting solution was stirred for 30 minutes, and amidosulfuric acid (0.5 g) was further added thereto. Separately, phenol (0.4 g) was dissolved in potassium carbonate (2.76 g) and water (50 mL), the solution was cooled in an ice bath, the above-described THF solution was added dropwise thereto, and the resulting solution was stirred at room temperature (23° C.) for 1 hour.

After the solution was stirred, water (200 mL) was added thereto, and the precipitated solid was separated by suction filtration, thereby obtaining 1.7 g of a compound Y1-3.

The compound Y1-3 (0.6 g), the compound y1 (0.8 g), and potassium carbonate (0.95 g) were dissolved in DMAc (30 mL, dimethylacetamide) and the solution was stirred at 90° C. for 3.5 hours. After the solution was stirred, water (300 mL) was added thereto, and the precipitated solid was separated by suction filtration, thereby obtaining 0.3 g of a third dichroic material Y1 as a yellowish orange solid. Further, $^1$H-NMR data of the obtained third dichroic material Y1 is shown below.

$^1$H-NMR (solvent: CDCl$_3$) S (ppm): 1.93 (m, 8H), 4.11 (m, 4H), 4.29 (m, 4H), 5.83-5.87 (d, 2H), 6.10-6.18 (dd, 2H), 6.39-6.45 (d, 2H), 7.02 (d, 2H), 7.77-8.13 (m, 15H)

Synthesis Example 4

A liquid crystal compound L1 was prepared according to the following procedures.

<Synthesis of Compound L1-2> reached 1.13 kg. Water (478 mL) was added to the obtained solution, and concentrated hydrochloric acid (278 g) was added dropwise thereto. Ethyl acetate (1.45 kg) was added thereto, and the solution was stirred at 30° C. for 10 minutes, and the aqueous layer was removed by performing the liquid separation operation. Next, a 20 wt % sodium chloride solution (960 mL) was added thereto, the solution was stirred at 30° C. for 10 minutes, and the aqueous layer was removed by performing the liquid separation operation. N-methylpyrrolidone (824 g) was added to the obtained organic layer, and a concentration operation was performed thereon at 70° C. for 4 hours to obtain 1.13 kg of a N-methylpyrrolidone solution containing a compound (L1-1). The next step was performed using 1085 g of the obtained N-methylpyrrolidone solution containing the obtained compound (L1-1). N,N-dimethylaniline (189 g) and 2,2,6,6-tetramethylpiperazine (1.5 g) were added to the obtained N-methylpyrrolidone solution (1085 g) containing the obtained compound (L1-1), the internal temperature was lowered, and acrylic acid chloride (122 g) was added dropwise thereto such that the internal temperature did not rise above 10° C. The solution was stirred at an internal temperature of 10° C. for 2 hours, methanol (81 g) was added dropwise thereto, and the resulting solution was stirred for 30 minutes. Ethyl acetate (1.66 kg), 10 wt % sodium chloride solution (700 mL), and 1 N aqueous hydrochloric acid (840 mL) were added thereto, and the aqueous layer was removed by performing the liquid separation operation. Next, a 10 wt % sodium chloride solution (800 mL) was added thereto, the solution was stirred at 30° C. for 10

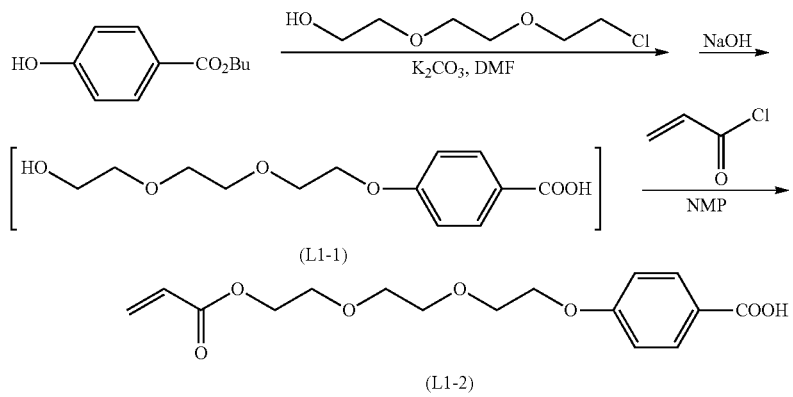

2-Chloroethoxyethoxyethanol (244 g) and potassium carbonate (200 g) were added to a solution of butylparaben (201 g) in N,N-dimethylformamide (300 mL). The solution was stirred at 95° C. for 9 hours, toluene (262 mL) and water (660 mL) were added thereto, and concentrated hydrochloric acid (147 g) was added dropwise thereto. The reaction solution was stirred for 10 minutes, allowed to stand, and washed by performing a liquid separation operation. A 28 wt % (28 mass %) sodium methoxide methanol solution (500 g) and water (402 mL) were added to the obtained organic layer, and the solution was stirred at 50° C. for 2 hours. Thereafter, the organic solvent was distilled off by concentration, water (402 mL) was added thereto, and the solution was concentrated again at 50° C. until the weight thereof minutes, and the aqueous layer was removed by performing the liquid separation operation. Next, a 20 wt % sodium chloride solution (800 mL) was added thereto, the solution was stirred at 30° C. for 10 minutes, and the aqueous layer was removed by performing the liquid separation operation. A mixed solvent of hexane/isopropyl alcohol (1780 mL/900 mL) was added to the obtained organic layer, and the solution was cooled to 5° C., stirred for 30 minutes, and then filtered, thereby obtaining 209 g of a white solid compound (L1-2) (yield of 65%).

$^1$H-NMR (solvent: CDCl$_3$) δ (ppm): 3.67-3.78 (m, 6H), 3.87-3.92 (m, 2H), 4.18-4.23 (m, 2H), 4.31-4.35 (m, 2H), 5.80-5.85 (m, 1H), 6.11-6.19 (m, 1H), 6.40-6.46 (m, 1H), 6.93-6.98 (m, 2H), 8.02-8.07 (m, 2H)

<Synthesis of Compound L-3>

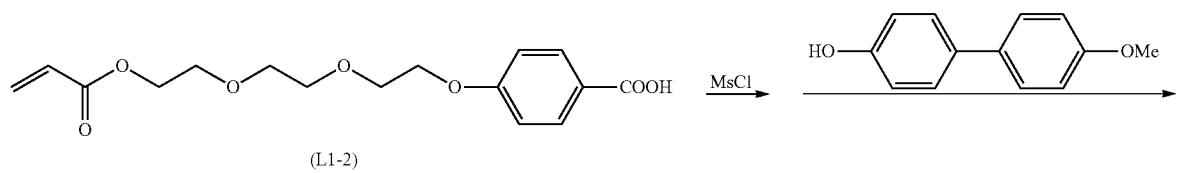

(L1-2)

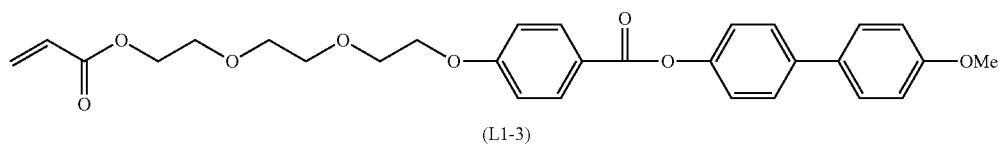

(L1-3)

Dibutylhydroxytoluene (BHT) (200 mg) was added to a solution of methanesulfonyl chloride (MsCl) (73.4 mmol, 5.7 mL) in tetrahydrofuran (THF) (70 mL), and the internal temperature thereof was lowered to −5° C. A THF solution of the compound (L1-2) (66.7 mmol, 21.6 g) and diisopropylethylamine (DIPEA) (75.6 mmol, 13.0 mL) was added dropwise thereto such that the internal temperature thereof did not rise above 0° C. or higher. The solution was stirred at −5° C. for 30 minutes, N,N-dimethyl-4-aminopyridine (DMAP) (200 mg) was added thereto, and a solution of diisopropylethylamine (75.6 mmol, 13.0 mL) and 4-hydroxy-4'-methoxy biphenyl (60.6 mmol, 12.1 g) in tetrahydrofuran (THF) and dimethylacetamide (DMAc) was added dropwise thereto such that the internal temperature thereof did not rise above 0° C. or higher. Thereafter, the solution was stirred at room temperature for 4 hours. The reaction was stopped by adding methanol (5 mL) to the solution, water and ethyl acetate were added thereto. The solvent was removed from the organic layer extracted with ethyl acetate using a rotary evaporator, and the organic layer was purified by column chromatography using ethyl acetate and hexane, thereby obtaining 18.7 g (yield of 61%) of a compound (L1-3) as a white solid. In the structural formula, Me represents a methyl group.

$^1$H-NMR (solvent: CDCl$_3$) δ (ppm): 3.65-3.82 (m, 6H), 3.85 (s, 3H), 3.85-3.95 (m, 2H), 4.18-4.28 (m, 2H), 4.28-4.40 (m, 2H), 5.82 (dd, 1H), 6.15 (dd, 1H), 6.43 (dd, 1H), 6.90-7.05 (m, 4H), 7.20-7.30 (m, 2H), 7.45-7.65 (m, 4H), 8.10-8.20 (m, 2H)

The following compound (L1-b) was contained as an impurity.

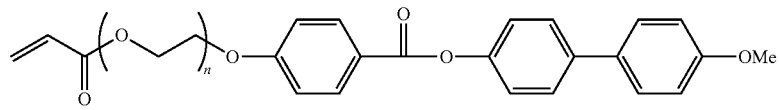

n represents an integer other than 3 (L1-b)

<Synthesis of Compound L1-23>

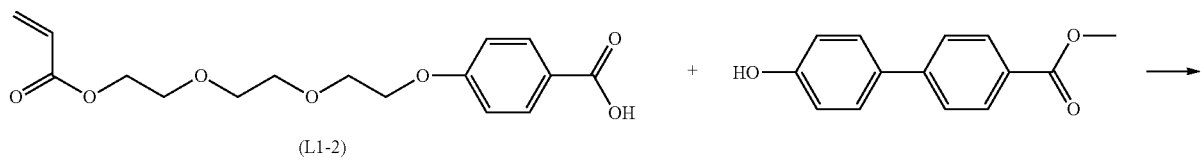

(L1-2)

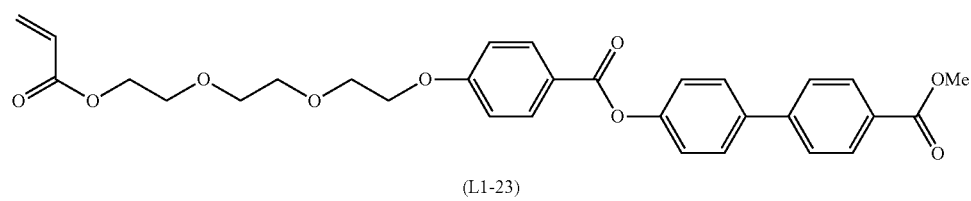

(L1-23)

Methyl 4-(4-hydroxyphenyl) benzoate was synthesized according to the method described in Journal of Polymer Science, Part A: Polymer Chemistry, 2012, vol. 50, p. 3936 to 3943.

2,2,6,6-Tetramethylpiperidine 1-oxyl (68 mg) was added to a solution of methanesulfonyl chloride (MsCl) (54.8 mmol, 6.27 g) in ethyl acetate (44 mL), and the internal temperature thereof was lowered to −5° C. A THF solution of the compound (L1-2) (52.6 mmol, 17.1 g) synthesized in the above-described manner and diisopropylethylamine (DIPEA) (57.0 mol, 7.36 g) was added dropwise thereto such that the internal temperature thereof did not rise above 0° C. or higher. After the solution was stirred at −5° C. for 30 minutes, a solution of methyl 4-(4-hydroxyphenyl) benzoate (43.8 mmol, 10.0 g) in DMAc and N-methyl-imidazole (NMI) (1.8 g) were added thereto, and diisopropylethylamine (75.6 mmol, 13.0 mL) was added dropwise thereto such that the internal temperature thereof did not rise above 0° C. or higher. Thereafter, the solution was stirred at room temperature for 4 hours. The reaction was stopped by adding water and ethyl acetate to the solution. Liquid separation was performed so that the solvent was removed from the organic layer extracted with ethyl acetate using a rotary evaporator, and the organic layer was purified by column chromatography using ethyl acetate and hexane, thereby obtaining 20.4 g (yield of 87%) of a compound (L1-23) as a white solid.

$^1$H-NMR (solvent: CDCl$_3$) δ (ppm): 3.68-3.80 (m, 6H), 3.87-3.95 (m, 2H), 3.95 (s, 3H), 4.20-4.27 (m, 2H), 4.31-4.37 (m, 2H), 5.83 (dd, 1H), 6.16 (dd, 1H), 6.43 (dd, 1H), 6.97-7.05 (m, 2H), 7.28-7.35 (m, 2H), 7.64-7.72 (m, 4H), 8.08-8.20 (m, 4H)

The following compound (L1-b2) was contained as an impurity.

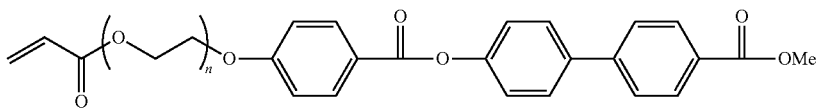

n represents an integer other than 3 (L1-b2)

<Synthesis of Liquid Crystal Compound L1>

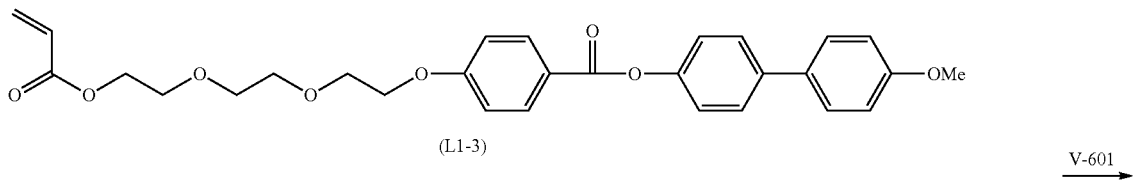

(L1-3)

V-601 →

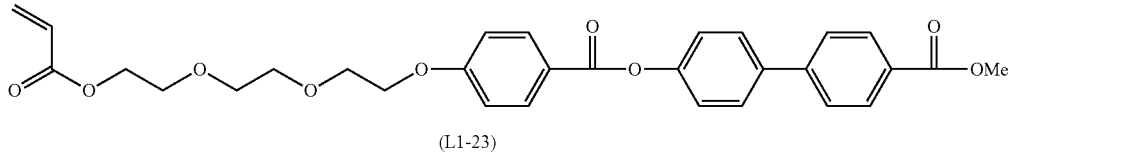

(L1-23)

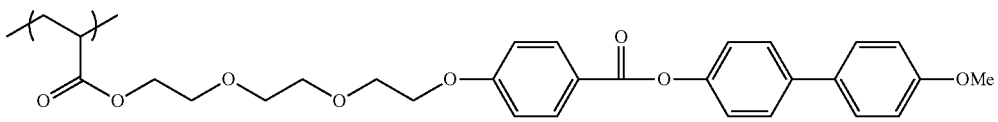

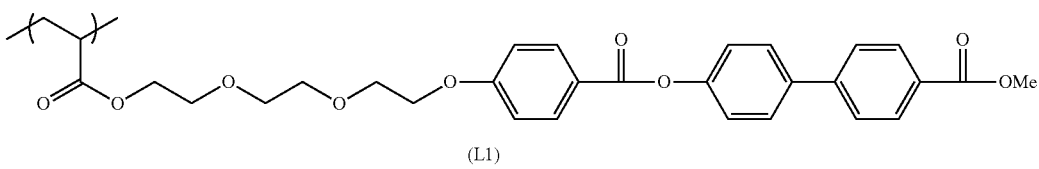

(L1)

The compound (L1-3) (84 g), the compound (L1-23) (21 g), and dibutylhydroxytoluene (BHT) (158 mg) were dissolved in anisole (337 g). Dimethyl 2,2'-azobis(2-methylpropionate) (1660 mg) (trade name: "V-601") was added thereto at room temperature, and the solution was stirred. The obtained anisole solution was added dropwise to anisole (84 g) heated to 80° C. in a nitrogen atmosphere for 2 hours, and the resulting solution was stirred at 80° C. for 4 hours after the completion of the dropwise addition. The obtained reaction solution was added dropwise to methanol (1080 mL), and the precipitate was collected by a filtration operation, and the residue was washed with acetonitrile, thereby obtaining 100 g (yield of 95%) of a white solid compound (L1). The weight-average molecular weight (Mw) of the obtained polymer was 13300.

Further, the molecular weight was calculated by gel permeation chromatography (GPC) in terms of polystyrene, three of TOSOH TSKgel Super AWM-H (manufactured by Tosoh Corporation) were connected to each other and used as columns, and N-methylpyrrolidone was used as a solvent.

Example 1

[Preparation of Transparent Support 1]

A TAC base material ("TG40", manufactured by FUJIFILM Corporation) having a thickness of 40 μm was continuously coated with an alignment film coating solution 9 having the following composition using a #8 wire bar. Thereafter, the base material was dried with warm air at 100° C. for 2 minutes, thereby obtaining a transparent support 1 in which a polyvinyl alcohol (PVA) alignment film having a thickness of 0.8 μm was formed on the TAC base material.

Further, modified polyvinyl alcohol was added to the alignment film coating solution such that the concentration of solid contents was set to 4 wt %.

Composition of Alignment Film Coating Solution 1
Modified polyvinyl alcohol shown below: 2.00 parts by mass
Water: 74.08 parts by mass
Methanol: 23.86 parts by mass
Polymerization initiator (IRGACURE 2959, manufactured by BASF SE): 0.06 parts by mass
Modified Polyvinyl Alcohol

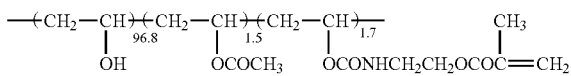

[Formation of Alignment Film 1]

41.6 parts by mass of butoxyethanol, 41.6 parts by mass of dipropylene glycol monomethyl ether, and 15.8 parts by mass of pure water were added to 1 part by mass of a photo-alignment material E-1 having the following structure, and the obtained solution was filtered using a 0.45 μm membrane filter under pressure, thereby preparing a coating solution 1 for a photo-alignment film.

Thereafter, the transparent support 1 was coated with the obtained coating solution 1 for a photo-alignment film and dried at 60° C. for 1 minute. Next, the obtained coating film was irradiated with linearly polarized ultraviolet rays (illuminance of 4.5 mW, irradiation dose of 500 mJ/cm$^2$) using a polarized ultraviolet ray exposure device, thereby preparing an alignment film 1.

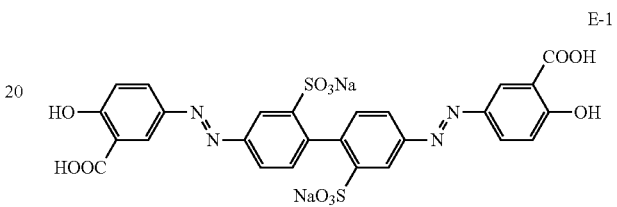

E-1

[Preparation of Polarizer 1]

The obtained alignment film 1 was continuously coated with the following polarizer-forming composition 1 using a #7 wire bar to form a coating film 1.

Next, the coating film 1 was heated at 140° C. for 90 seconds, and the coating film 1 was cooled to room temperature (23° C.).

Next, the coating film 1 was heated at 90° C. for 60 seconds and cooled to room temperature again.

Thereafter, the coating film 1 was irradiated under an irradiation condition of an illuminance of 28 mW/cm$^2$ for 60 seconds using a high-pressure mercury lamp, thereby preparing a polarizer 1 on the alignment film 1.

Composition of Polarizer-Forming Composition 1
Liquid crystal compound L1 shown below: 5.258 parts by mass
Dichroic material M1 shown below: 0.263 parts by mass
Dichroic material C1 shown below: 0.711 parts by mass
Dichroic material Y1 shown below: 0.167 parts by mass
Interface modifier F1 shown below: 0.050 parts by mass
Polymerization initiator 11 (IRGACURE 819, manufactured by BASF SE): 0.051 parts by mass
Cyclopentanone: 65.450 parts by mass
Tetrahydrofuran: 28.050 parts by mass

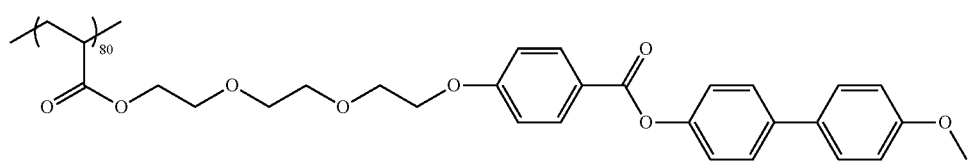

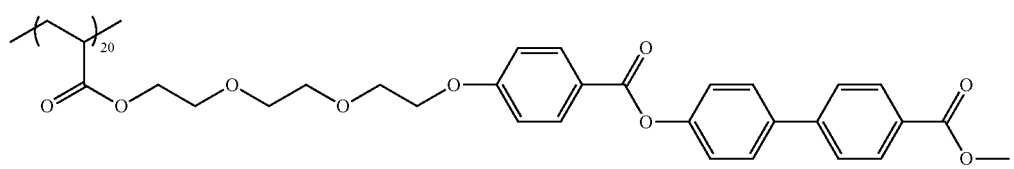

L1

-continued

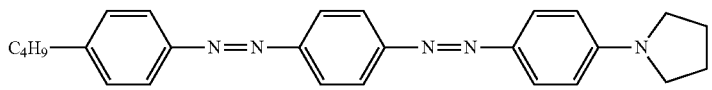
M1

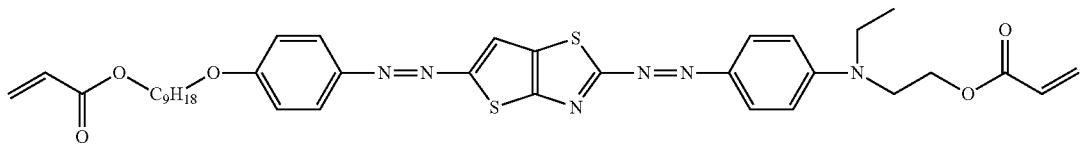
C1

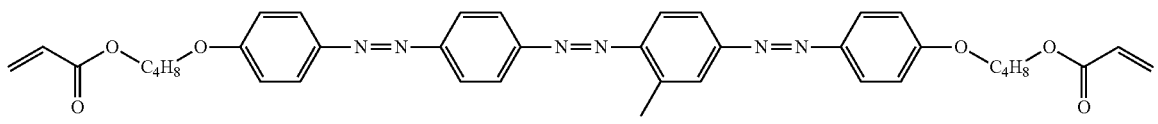
Y1

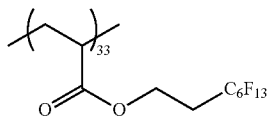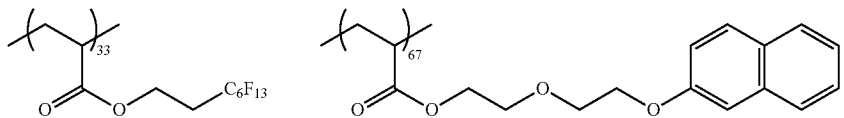
F1

[Preparation of Polarizers 1-1 to 1-3]

The obtained alignment film 1 was continuously coated with the following polarizer-forming compositions 1-1 to 1-3 using a #7 wire bar to form coating films 1-1 to 1-3.

Next, each coating film was heated at 140° C. for 90 seconds, and each coating film was cooled to room temperature (23° C.).

Next, the coating film 1 was heated at 90° C. for 60 seconds and cooled to room temperature again.

Thereafter, each coating film was irradiated under an irradiation condition of an illuminance of 28 mW/cm² for 60 seconds using a high-pressure mercury lamp, thereby preparing a polarizer 1-1 (film 1-1), a polarizer 1-2 (film (1-2), and a polarizer 1-3 (film 1-3) on the alignment film 1.

Composition of Polarizer-Forming Composition 1-1
Liquid crystal compound L1 shown above: 6.079 parts by mass
Dichroic material M1 shown above: 0.304 parts by mass
Interface modifier F1 shown above: 0.058 parts by mass
Polymerization initiator I1 (IRGACURE 819, manufactured by BASF SE): 0.059 parts by mass
Cyclopentanone: 65.450 parts by mass
Tetrahydrofuran: 28.050 parts by mass Composition of Polarizer-Forming Composition 1-2
Liquid crystal compound L1 shown above: 5.630 parts by mass
Dichroic material C1 shown above: 0.761 parts by mass
Interface modifier F1 shown above: 0.054 parts by mass
Polymerization initiator I1 (IRGACURE 819, manufactured by BASF SE): 0.055 parts by mass
Cyclopentanone: 65.450 parts by mass
Tetrahydrofuran: 28.050 parts by mass Composition of Polarizer-Forming Composition 1-3
Liquid crystal compound L1 shown above: 6.377 parts by mass
Interface modifier F1 shown above: 0.061 parts by mass
Polymerization initiator I1 (IRGACURE 819, manufactured by BASF SE): 0.062 parts by mass
Cyclopentanone: 65.450 parts by mass
Tetrahydrofuran: 28.050 parts by mass <Calculation of Maximum Absorption Wavelength>

The absorbance of each light absorption anisotropic film in a wavelength range of 380 nm to 780 nm was measured at a pitch of 1 nm, the absorption spectrum of each of the prepared polarizers 1, 1-1, and 1-2 was measured using a multi-channel spectrometer (product name, "QE65000", manufactured by Ocean Optics, Inc.), and the following maximum absorption wavelength thereof was calculated. The results are listed in Table 1.

λ1: the maximum absorption wavelength in the absorption spectrum of the polarizer 1-1
λM: the maximum absorption wavelength in the difference spectrum between the absorption spectrum of the polarizer 1 and the absorption spectrum of the polarizer 1-2
λ2: the maximum absorption wavelength in the absorption spectrum of the polarizer 1-2
λC: the maximum absorption wavelength in the difference spectrum between the absorption spectrum of the polarizer 1 and the absorption spectrum of the polarizer 1-1

Further, a tetrahydrofuran solution was prepared for each of the first dichroic material (dichroic material M1) and the second dichroic material (dichroic material C1), the absorbance in a wavelength range of 380 nm to 780 nm was measured at a pitch of 1 nm using UA-3100PC (manufactured by Shimadzu Corporation), and the maximum absorption wavelength (λ1') of the first dichroic material and the maximum absorption wavelength (2') of the second dichroic material were calculated. The results are listed in Table 1.

<XRD>

The prepared polarizer 1, polarizer 1-1, and polarizer 1-3 were cut into a size of 40 mm×40 mm, the surface of each polarizer was irradiated with X-rays using an X-ray diffractometer for evaluating a thin film (trade name: "SmartLab" manufactured by Rigaku Corporation) under the following conditions, and the in-plane XRD was performed.

Further, an angle in a state where the polarizer was disposed such that the incident direction of X-rays and the direction in which the liquid crystal compound and the dichroic material were aligned in a major axis direction were parallel to each other was set as an azimuthal angle (φ) of 0°, and in-plane XRD (2θχ/φ scan) was performed in all directions for every 150, and the orientation in the substrate plane where the peak intensity was the maximum was determined by φ scan performed with respect to the observed peak. Both measurements were performed using CuKα at an incidence angle of 0.20°.

(Conditions)

Cu ray source to be used (CuKα, output of 45 kV, 200 mA)

X-ray incidence angle of 0.2°

Optical system to be used: parallel optical system (CBO (PB))

Figure 3:
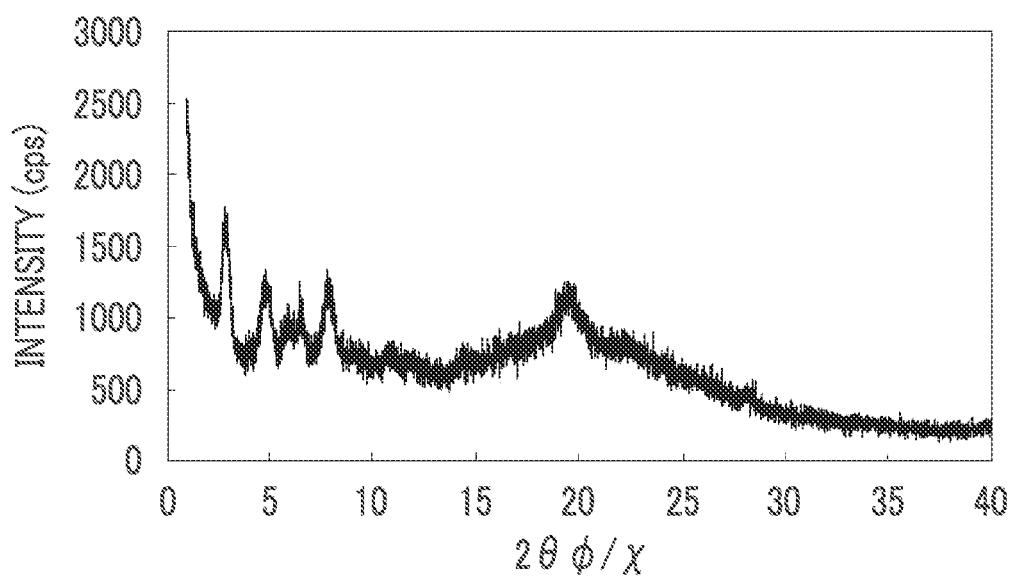
FIG. 3 is a graph showing an X-ray diffraction (XRD) spectrum corresponding to a polarizer 1 (film 1) of Example 1.
Figure 4:
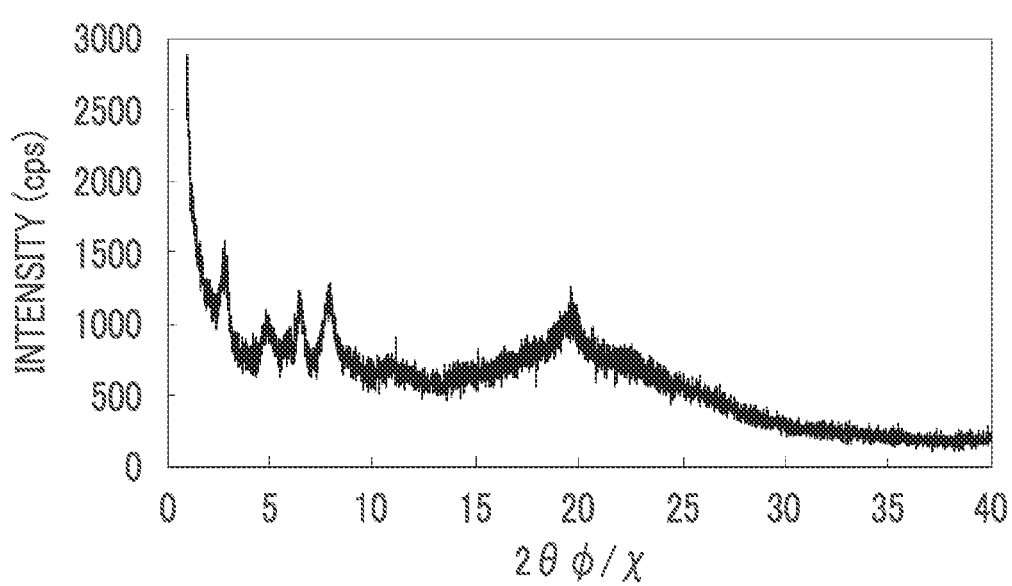
FIG. 4 is a graph showing an XRD spectrum corresponding to a polarizer (film 1-1).
Figure 5:
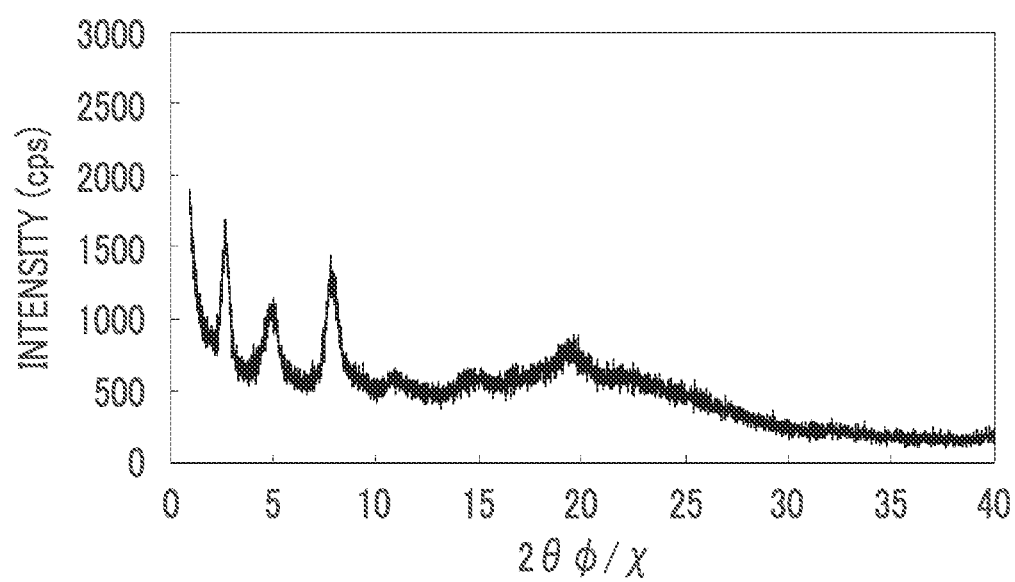
FIG. 5 is a graph showing an XRD spectrum corresponding to a polarizer 1-3 (film 1-3).

Incident side, incident slit having a width of 0.2 mm, incident parallel slit in-plane PSC at 0.5 deg, longitudinal limit slit having a width of 10 mm Light-receiving side, light-receiving slit having a width of 20 mm, light-receiving parallel slit in-plane PSA at 0.5 deg Detector: HyPix3000 (OD mode) manufactured by Rigaku Corporation 2θχ/φ Scan, scan conditions: 0.008 degrees/step, 2.0 degrees/min in a range of 1 to 40 degrees φ Scan, scan conditions: 0.5 degree/step, 9.6 degree/min in a range of −120 to 120 degrees In the polarizer 1-3, peaks were observed at positions where 2θ was 2.8, 4.9°, and 7.9° in the direction of 90° (the orientation determined as described above) (see FIG. 3).

Meanwhile, in the polarizer 1-2, peaks were observed at positions where 2θ was 6.4 in addition to the peaks at positions where 2θ was 2.8, 4.9°, and 7.9° (see FIG. 2).

Therefore, it was found that the peak at 6.4° in FIG. 2 is the peak derived from the first dichroic material M1. The peak intensity (M) of this peak was 412.

Similarly, in the polarizer 1, peaks were observed at the positions where 2θ was 2.8°, 4.9°, 6.4, and 7.9° as in the case of the polarizer 1-1 (see FIG. 1), and the peak intensity (MO) of the peak at 6.40 was 400.

Therefore, it is assumed that since the first dichroic material forms the array structure (specifically, the crystal structure) in the polarizer 1 and the polarizer 1-1 the intensities of the peaks derived from the first dichroic material M1 in the polarizer 1 and the polarizer 1-1 are the same as each other.

Further, the value of the peak intensity (MO) with respect to the peak intensity (M), that is, MO/M can be calculated as 0.97.

In the polarizer 1-3, peaks were not observed at positions where 2θ was in a range of 1° to 15° in the direction of 30° (the orientation determined as described above).

Meanwhile, in the polarizer 1-2, a peak was observed at the position where 2θ was 3.7°, and the peak intensity (C) thereof was 610.

Therefore, it was found that the peak at 3.7° is the peak derived from the second dichroic material C1.

Similarly, in the polarizer 1, a peak was observed at the position where 2θ was 3.7° as in the case of the polarizer 1-2. The peak intensity (CO) of this peak was 600.

Therefore, it is assumed that since the second dichroic material forms the array structure (specifically, the crystal structure) in the polarizer 1 and the polarizer 1-2, the intensities of the peaks derived from the second dichroic material C1 in the polarizer 1 and the polarizer 1-2 are the same as each other.

Further, the value of the peak intensity (CO) with respect to the peak intensity (C), that is, CO/C can be calculated as 0.98.

[Preparation of Laminate 1]

<Formation of Transparent Resin Layer (Barrier Layer) 1>

The polarizer 1 was continuously coated with the following curable composition 1 using a #2 wire bar and dried at 60° C. for 5 minutes.

Next, the polarizer 1 was irradiated under an irradiation condition of an illuminance of 28 mW/cm$^2$ for 60 seconds using a high-pressure mercury lamp so that the curable composition 1 was cured, thereby preparing a laminate in which a transparent resin layer (barrier layer) 1 was formed on the polarizer 1. In this manner, a laminate 1 of Example 1 was obtained.

The cross section of the transparent resin layer 1 was cut using a microtome cutting machine, and the film thickness thereof was measured by observation with a scanning electron microscope (SEM), and the film thickness was approximately 1.0 μm.

Curable Composition 1

Polymerizable compound KAYARAD PET-30 (manufactured by Nippon Kayaku Co., Ltd.): 29 parts by mass Polymerization initiator IRGACURE 819 (manufactured by BASF SE): 1 part by mass Alumina ethanol sol A2K5-10 (manufactured by Kawaken Fine Chemicals Co., Ltd., colloid liquid obtained by dispersing columnar alumina hydrate particles in liquid): 70 parts by mass

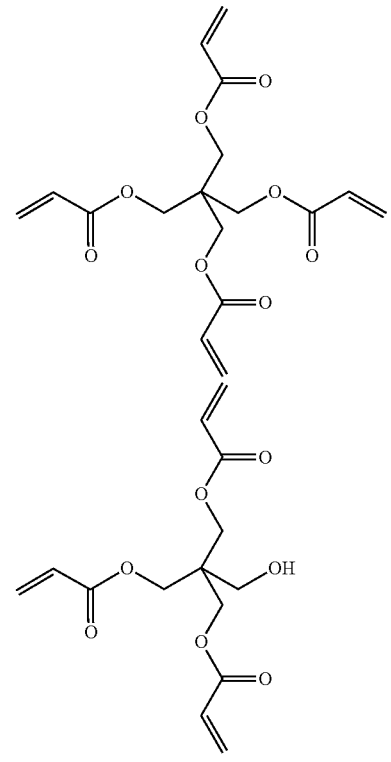

KAYARAD PET-30

Examples 2 to 9 and Comparative Examples 1 and 2

Each polarizer and each laminate were prepared according to the same procedures as in Example 1 except that the polarizer-forming composition having the composition listed in Table 1 was used in place of the polarizer-forming composition 1, and the maximum absorption wavelength thereof was calculated according to the same method as in Example 1. The results are listed in Table 1.

The comparison of the XRD spectra was performed on the polarizers prepared in Examples 2 to 9 in the same manner as in Example 1. As the result, it was confirmed that the peak M derived from the first dichroic material present in the polarizer 2-1 or the like corresponding to the polarizer 1-1 and the peak C derived from the second dichroic material present in the polarizer 2-2 or the like corresponding to the polarizer 1-2 were seen in the polarizer 2 or the like corresponding to the polarizer 1, and only the first dichroic material formed a crystal structure and only the second dichroic material formed a crystal structure in the polarizer 2 or the like.

On the contrary, the comparison of the XRD spectra was performed on the polarizers prepared in Comparative Examples 1 and 2 in the same manner as in Example 1. As the result, it could not be confirmed that only the first dichroic material formed a crystal structure or only the second dichroic material formed a crystal structure.

Further, the components used in each example including Example 1 are collectively shown below.

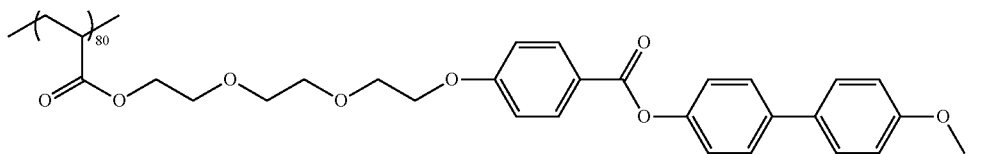

L1

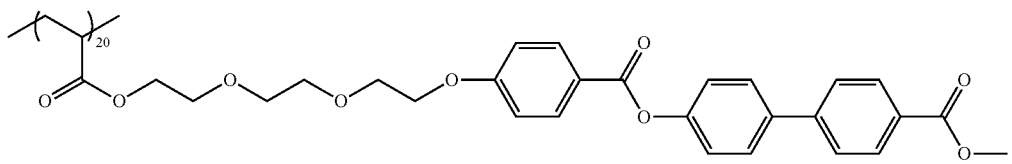

L2

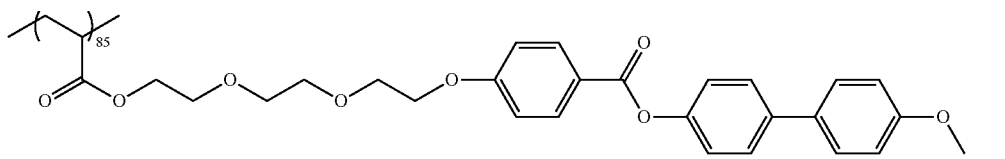

L3

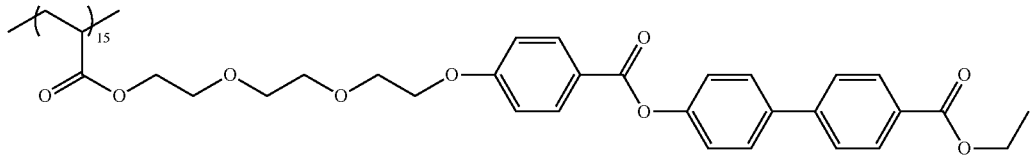

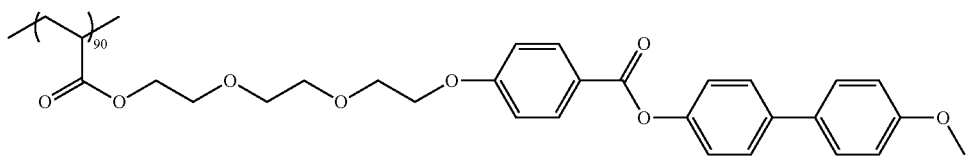

M1

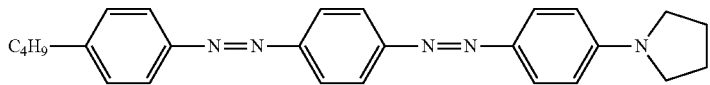

M2

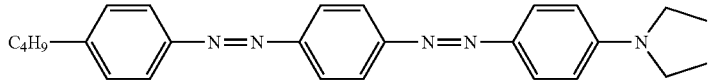

-continued
M3
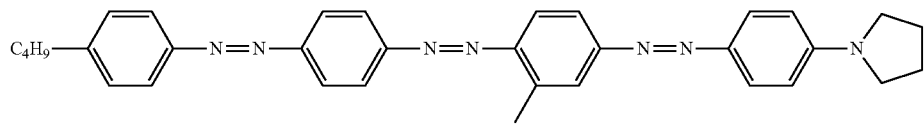
M4
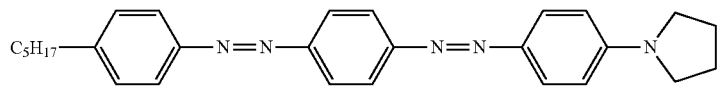
M5
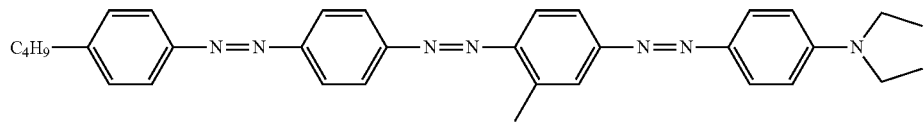
M6
M7
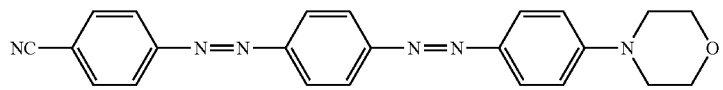
M8
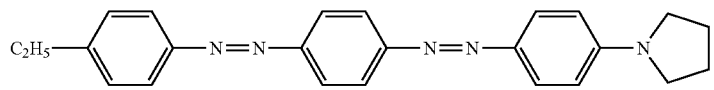
C1
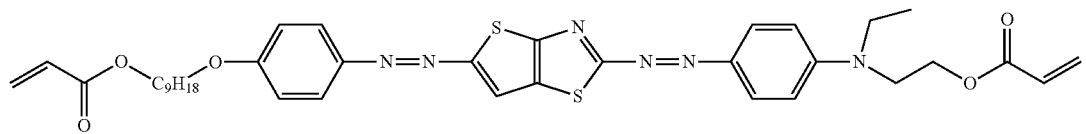
C2
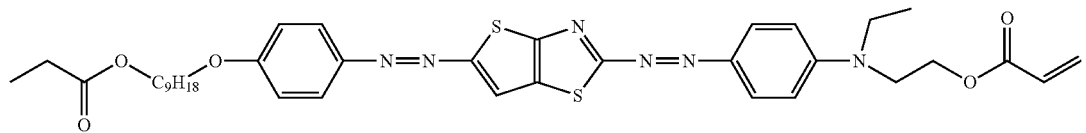
C3
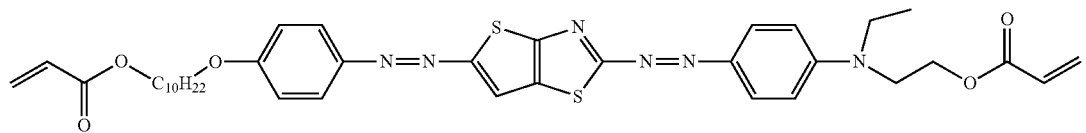
C4
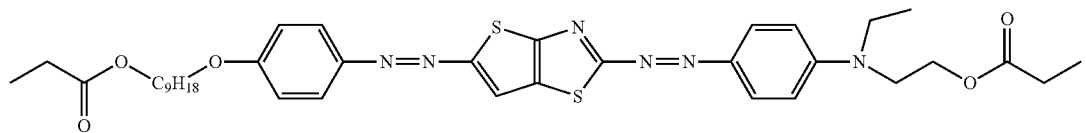
Y1
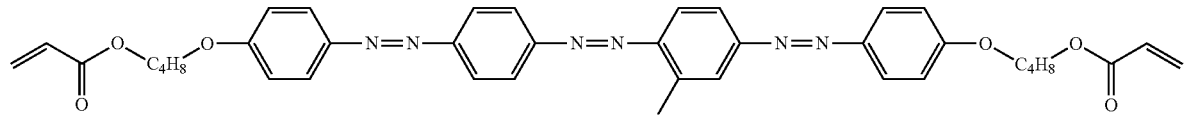

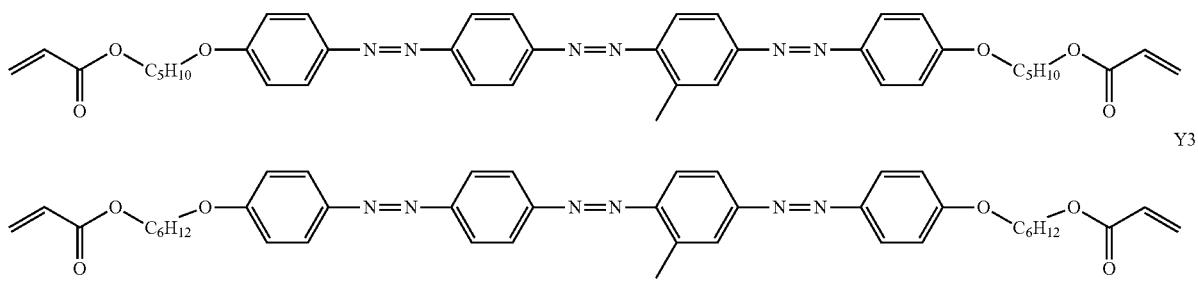

[Evaluation]

The following evaluations were performed on the polarizers and laminates of the examples and the comparative examples obtained as described above.

[Degree of Alignment]

Each laminate prepared in the examples and the comparative examples was set on a sample table in a state in which a linear polarizer was inserted on a light source side of an optical microscope (product name, "ECLIPSE E600 POL", manufactured by Nikon Corporation), the absorbance of the light absorption anisotropic film in a wavelength range of 380 nm to 780 nm was measured at a pitch of nm using a multi-channel spectrometer (product name, "QE65000", manufactured by Ocean Optics, Inc.), and the degrees of alignment was calculated according to the following equation. The results are listed in Table 1.

Degree of alignment: $S=((Az0/Ay0)-1)/((Az0/Ay0)+2)$

Az0: Absorbance of dye film with respect to polarized light in absorption axis direction Ay0: Absorbance of dye film with respect to polarized light in polarization axis direction In the equation described above, "Az0" represents the absorbance of the light absorption anisotropic film with respect to the polarized light in the absorption axis direction, and "Ay0" represents the absorbance of the light absorption anisotropic film with respect to the polarized light in the polarization axis direction.

TABLE 1

| | Liquid crystal compound | | | first dichroic material | | | | Second dichroic material | | | Third dichroic material | | Interface modifier | |
|---|---|---|---|---|---|---|---|---|---|---|---|---|---|---|
| | | Parts by mass | logP molecule | Type | Parts by mass | logP Molecule | Side chain | Type | Parts by mass | logP side chain | Type | Parts by mass | Type | Parts by mass |
| | Type | | | | | | | | | | | | | |
| Example 1 | L1 | 5.258 | 4.6 | M1 | 0.263 | 8.1 | 2.2 | C1 | 0.711 | 3.5 | Y1 | 0.167 | F1 | 0.050 |
| Example 2 | L2 | 5.051 | 4.6 | M1 | 0.259 | 8.1 | 2.2 | C2 | 0.907 | 3.7 | Y1 | 0.181 | F1 | 0.051 |
| Example 3 | L1 | 5.262 | 4.6 | M1 | 0.257 | 8.1 | 2.2 | C2 | 0.714 | 3.7 | Y2 | 0.167 | F1 | 0.050 |
| Example 4 | L1 | 5.219 | 4.6 | M2 | 0.258 | 9.4 | 2.2 | C3 | 0.741 | 4.7 | Y1 | 0.180 | F1 | 0.050 |
| Example 5 | L3 | 5.250 | 4.6 | M1 | 0.259 | 8.1 | 2.2 | C4 | 0.726 | 3.7 | Y2 | 0.162 | F1 | 0.051 |
| Example 6 | L2 | 5.170 | 4.6 | M3 | 0.271 | 9.8 | 2.2 | C2 | 0.763 | 3.7 | Y2 | 0.194 | F1 | 0.050 |
| Example 7 | L2 | 5.219 | 4.6 | M4 | 0.264 | 9.0 | 3.3 | C3 | 0.741 | 4.7 | Y2 | 0.174 | F1 | 0.050 |
| Example 8 | L1 | 5.172 | 4.6 | M5 | 0.262 | 11.1 | 2.2 | C2 | 0.753 | 3.7 | Y1 | 0.210 | F1 | 0.051 |
| Example 9 | L3 | 5.172 | 4.6 | M6 | 0.262 | 8.3 | 1.5 | C3 | 0.753 | 4.7 | Y2 | 0.210 | F1 | 0.051 |
| Comparative example 1 | L2 | 5.327 | 4.6 | M7 | 0.257 | 4.6 | −0.7 | C2 | 0.642 | 3.7 | Y1 | 0.173 | F1 | 0.050 |
| Comparative example 2 | L1 | 5.016 | 4.6 | M8 | 0.289 | 7.1 | 1.3 | C1 | 0.836 | 3.5 | Y3 | 0.257 | F1 | 0.050 |

| | Polymerization initiator | | Tetrahydrofuran | Cyclopentanone | Maximum absorption wavelength (nm) | | | | | | Degree of alignment |
|---|---|---|---|---|---|---|---|---|---|---|---|
| | Type | Parts by mass | Parts by mass | Parts by mass | λ1 | λ1' | λM | λ2 | λ2' | λC | |
| Example 1 | I1 | 0.051 | 65.450 | 28.050 | 555 | 523 | 555 | 620 | 581 | 620 | 0.969 |
| Example 2 | I1 | 0.052 | 65.450 | 28.050 | 556 | 524 | 556 | 617 | 580 | 616 | 0.969 |
| Example 3 | I1 | 0.051 | 65.450 | 28.050 | 555 | 523 | 555 | 617 | 580 | 617 | 0.968 |
| Example 4 | I1 | 0.052 | 65.450 | 28.050 | 514 | 484 | 510 | 615 | 582 | 616 | 0.956 |
| Example 5 | I1 | 0.052 | 65.450 | 28.050 | 555 | 524 | 557 | 618 | 581 | 619 | 0.968 |
| Example 6 | I1 | 0.052 | 65.450 | 28.050 | 539 | 512 | 535 | 617 | 580 | 618 | 0.968 |
| Example 7 | I1 | 0.052 | 65.450 | 28.050 | 521 | 486 | 517 | 615 | 582 | 615 | 0.960 |
| Example 8 | I1 | 0.052 | 65.450 | 28.050 | 535 | 523 | 531 | 617 | 580 | 617 | 0.959 |
| Example 9 | I1 | 0.052 | 65.450 | 28.050 | 550 | 525 | 547 | 618 | 581 | 618 | 0.967 |
| Comparative example 1 | I1 | 0.051 | 65.450 | 28.050 | 518 | 517 | 514 | 615 | 580 | 617 | 0.938 |
| Comparative example 2 | I1 | 0.051 | 65.450 | 28.050 | 503 | 504 | 500 | 618 | 581 | 616 | 0.931 |

According to the results obtained by measuring the maximum absorption wavelengths listed in Table 1, it is assumed that the first dichroic materials form an associate and the second dichroic materials form an associate in the polarizers of Examples 1 to 9.

Further, according to the results obtained by measuring the XRD spectra of Examples 1 to 9, it is assumed that only the first dichroic material forms a crystal structure and only the second dichroic material forms a crystal structure in the polarizer of Example 1.

Based on the results described above, it can be said that the polarizers of the examples separately have the array structure formed of the first dichroic material and the array structure formed of the second dichroic material.

As described above, according to the polarizers of the examples which separately have the array structure formed of the first dichroic material and the array structure formed of the second dichroic material, it was found that the degrees of alignment were higher than those of the polarizers of the comparative examples as shown in the evaluation results of Table 1.

EXPLANATION OF REFERENCES

P: polarizer
M: molecule of first dichroic material
C: molecule of second dichroic material
L: molecule of liquid crystal compound
G: aggregate
w: width
a: angle

What is claimed is:

1. A polarizer which is formed of a polarizer-forming composition containing a liquid crystal compound, a first dichroic material, and a second dichroic material,
    wherein the polarizer has an array structure formed of the first dichroic material and an array structure formed of the second dichroic material, and
    wherein Expressions (I) and (II) are satisfied, $|\lambda M-\lambda 1|\leq 5$ nm  (I)

$|\lambda 1-\lambda 1'|\geq 5$ nm  (II)

in Expressions (I) and (II),
    $\lambda M$ represents a maximum absorption wavelength in a difference spectrum between an absorption spectrum of a film formed of a composition that contains the first dichroic material, the second dichroic material, and the liquid crystal compound and an absorption spectrum of a film formed of a composition that contains the second dichroic material and the liquid crystal compound but does not contain the first dichroic material,
    $\lambda 1$ represents a maximum absorption wavelength in an absorption spectrum of a film formed of a composition that contains the first dichroic material and the liquid crystal compound but does not contain the second dichroic material, and
    $\lambda 1'$ represents a maximum absorption wavelength in an absorption spectrum of a solution in which the first dichroic material is dissolved.

2. The polarizer according to claim 1,
    wherein Expressions (III) and (IV) are satisfied, $|\lambda C-\lambda 2|\leq 5$ nm  (III)

$|\lambda 2-\lambda 2'|\geq 5$ nm  (IV)

in Expressions (III) and (IV),
    $\lambda C$ represents a maximum absorption wavelength in a difference spectrum between an absorption spectrum of a film formed of a composition that contains the first dichroic material, the second dichroic material, and the liquid crystal compound and an absorption spectrum of a film formed of a composition that contains the first dichroic material and the liquid crystal compound but does not contain the second dichroic material,
    $\lambda 2$ represents a maximum absorption wavelength in an absorption spectrum of a film formed of a composition that contains the second dichroic material and the liquid crystal compound but does not contain the first dichroic material, and
    $\lambda 2'$ represents a maximum absorption wavelength in an absorption spectrum of a solution in which the second dichroic material is dissolved.

3. The polarizer according to claim 1,
    wherein Expression (V) is satisfied, $0.9 \leq MO/M \leq 1.1$  (V)

in Expression (V),
    MO represents an intensity of a peak derived from a periodic structure of the first dichroic material in an X-ray diffraction spectrum of a film formed of a composition that contains the first dichroic material, the second dichroic material, and the liquid crystal compound, and
    M represents an intensity of a peak derived from a periodic structure of the first dichroic material in an X-ray diffraction spectrum of a film formed of a composition that contains the first dichroic material and the liquid crystal compound but does not contain the second dichroic material.

4. The polarizer according to claim 1,
    wherein Expression (VI) is satisfied, $0.9 \leq CO/C \leq 1.1$  (VI)

in Expression (VI),
    CO represents an intensity of a peak derived from a periodic structure of the second dichroic material in an X-ray diffraction spectrum of a film formed of a composition that contains the first dichroic material, the second dichroic material, and the liquid crystal compound, and
    C represents an intensity of a peak derived from a periodic structure of the second dichroic material in an X-ray diffraction spectrum of a film formed of a composition that contains the second dichroic material and the liquid crystal compound but does not contain the first dichroic material.

5. The polarizer according to claim 1,
    wherein the first dichroic material is a dichroic material having a maximum absorption wavelength in a range of 455 nm or greater and less than 560 nm, and
    the second dichroic material is a dichroic material having a maximum absorption wavelength in a range of 560 nm to 700 nm.

6. The polarizer according to claim 5,
    wherein the polarizer-forming composition further contains a third dichroic material having a maximum absorption wavelength in a range of 380 nm or greater and less than 455 nm.

7. The polarizer according to claim 1,
    wherein an absolute value of a difference between a log P value of a side chain of the first dichroic material and a log P value of a side chain of the second dichroic material is 1.1 or greater.

8. An image display device comprising:
the polarizer according to claim 1.

9. The polarizer according to claim 1,
wherein a content of dichroic materials including the first dichroic material and the second dichroic material is 18.9% by mass or less with respect to a total solid content of the polarizer-forming composition.

* * * * *